US00RE35496E

United States Patent [19]

Yamamura et al.

[11] E Patent Number: Re. 35,496

[45] Reissued Date of Patent: Apr. 29, 1997

[54] SEMICONDUCTOR DEVICE AND METHOD OF PRODUCING THE SAME

[75] Inventors: Ken Yamamura; Naoto Ueda; Kazunari Michii; Hitoshi Fujimoto; Kiyoaki Tsumura; Hitoshi Sasaki; Takashi Miyamoto, all of Itami, Japan

[73] Assignee: Mitsubishi Denki Kabushiki Kaisha, Tokyo, Japan

[21] Appl. No.: 525,174

[22] Filed: Sep. 8, 1995

Related U.S. Patent Documents

Reissue of:

[64] Patent No.: 5,334,803
Issued: Aug. 2, 1994
Appl. No.: 968,055
Filed: Oct. 28, 1992

[30] Foreign Application Priority Data

Oct. 30, 1991 [JP] Japan ..... 3-284565
Sep. 17, 1992 [JP] Japan ..... 4-248367

[51] Int. Cl.[6] ..... H01L 23/02; H01L 23/08; H01L 43/00

[52] U.S. Cl. ..... 174/52.4; 174/52.2; 257/676; 257/692; 257/787; 361/728; 361/813; 29/854; 29/855; 29/841; 29/848

[58] Field of Search ..... 257/673, 675–676, 257/690–692, 700, 758, 775, 782, 784, 787; 361/728, 813; 174/52.2, 52.4; 29/841, 848, 850, 854–856

[56] References Cited

U.S. PATENT DOCUMENTS 4,984,059 1/1991 Kubota et al. .
5,068,712 11/1991 Murakami et al. ..... 257/676
5,155,578 10/1992 Lim et al. ..... 174/52.4

FOREIGN PATENT DOCUMENTS 60-64442 4/1985 Japan ..... 257/784
61-63043 4/1986 Japan ..... 257/676
312781 10/1986 Japan .
2-246125 10/1990 Japan .

OTHER PUBLICATIONS

IBM Technical Disclosure Bulletin, vol. 34 No. 1 Jun. 1991, pp. 358–359.

*Primary Examiner*—Bot L Ledynh
*Attorney, Agent, or Firm*—Leydig, Voit & Mayer

[57] ABSTRACT

A semiconductor device of the present invention accommodates a large semiconductor chip in a downsized package without impairing its reliability. The semiconductor chip is bonded on a relatively small die pad. Common inner leads and a plurality of inner leads are disposed opposite and spaced from the semiconductor chip by a gap ranging from 0.1 mm to 0.4 mm and the gap between the semiconductor chip and the common inner leads and the plurality of inner leads is filled with a resin which forms pan of a resin package.

15 Claims, 23 Drawing Sheets

SEMICONDUCTOR DEVICE AND METHOD OF PRODUCING THE SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor device and a method or producing the same and, more particularly, to a semiconductor having a plastic package and a method of producing it.

2. Description of the Related Art

FIG. 30 shows a configuration of the semiconductor device having a plastic package according to the prior art. A semiconductor chip 32 is carried on the die-pad 31, and a plurality of inner leads 34 are disposed on the peripheral area of the die-pad 31. As shown in FIG. 31, the inner leads 34 and corresponding electrodes pads 33 are connected by wire-bonding by means of respective metallic fine-wires 35. Each inner lead 34 is integrally connected with a corresponding outer lead 37. The die-pad 31, the semiconductor chip 32, the inner leads 34, and the metallic fine-wires 34 are sealed in a body 36 of the package made or an epoxy resin and the like in a manner such that the outer leads 37 extend to the outside of the body 36. Each outer lead 37 is bent along the shape of the body 36 of the package.

A description of the method of wire-bonding is given below. Commonly, a gold wire having a diameter from 25 to 30 μm is employed as the metallic fine-wire 35. An end portion of the metallic fine-wire 35 being run through a capillary chip (not shown in FIGS. 30 and 31) is heated and melted to form a round ball. A metallic-diffusion bonding between the ball and the electrode pad 33 is executed by applying load, heat, and ultrasonic energy to the ball, and then pressing it onto the electrode pad 33 of the semiconductor chip 32 by means of the capillary chip. Subsequently, the extra amount or the metallic fine-wire 35 is fed out from the capillary chip, and then the metallic fine-wire 35 is pressed onto the inner lead 34, thus enabling metallic-diffusion bonding between each metallic fine-wire 35 and inner lead 34.

The wire bonding is achieved by the above mentioned method; however, the following conditions must be satisfied for accomplishing completely reliable bonding:

1. The electrode pads 33 must be disposed on a peripheral area of the surface of the semiconductor chip 32 to prevent contact between the metallic fine-wire 35 and the edge portion of the semiconductor chip 32.

2. The distance between each electrode pad 33 and the semiconductor chip 32 must be 0.5 mm or more.

3. The clearance between each inner lead 34 and the die-pad must be 0.2 mm or more to insulate them from each other.

4. Each inner lead must have a length of at least 0.2 mm for bonding of the metallic fine-wire 35.

In order to fulfill all of the above requirements, the thickness of the body 36 of the package surrounding the semiconductor chip 32 must be at least 0.5 mm.

In accordance with the contemporary trend of high density integration and advanced functions of an IC device, the size of the semiconductor chip is becoming larger than before, whereas downsizing is required with respect to the package size of a semiconductor device in order to comply with demands for downsizing and miniaturizing of electronic equipment. As described above, it is required of the semiconductor device having the conventional configuration to have a thickness of 0.5 mm or more in a body of the package surrounding the semiconductor chip to ensure the reliability of the device; however, there is a drawback that a large semiconductor chip cannot be accommodated in a downsized package-body.

SUMMARY OF THE INVENTION

In order to overcome the above described problems, the present invention is aimed at providing a semiconductor device which can accommodate a large semiconductor chip in a downsized package-body without impairing its reliability.

Another object of the present invention is to provide a method of manufacturing the above described semiconductor device.

According to one aspect of the invention, there is provided a semiconductor device which comprises: a semiconductor chip having a first surface and a second surface at opposite sides, and also having a plurality of electrode pads linearly disposed substantially on a longitudinal center line of the first surface or the semiconductor chip: a die-pad bonded to the second surface of the semiconductor chip to support the chip, and having a smaller area than has the semiconductor chip; at least one common inner-lead situated above the first surface of the semiconductor chip, and disposed substantially parallel to the longitudinal center line of the semiconductor chip; a plurality of inner leads disposed in an area adjacent to the corresponding electrode pad of and above the first surface of the semiconductor chip; a plurality of metallic fine-wires electrically connecting the plurality or electrode pads with a common inner-lead and a corresponding inner lead; a body of a resin package sealing the semiconductor chip, the die-pad, the common inner-lead, the plurality or inner-leads, and the plurality of metallic fine-wires; common outer-leads each integrally connected with the common inner-lead, and each exposed outside of the body of the resin package; and a plurality of outer leads each integrally connected to the common inner-lead, and each exposed to the outside of the body or the resin package wherein [,] a gap between the first surface of the semiconductor chip and a geometric plane determined by the bottom surfaces of the common inner-lead and of the plurality or inner leads is [0.1 mm or more and 0.4 mm or less, and the gap is] filled with the resin which forms part of the body of the resin package.

According to another aspect of the invention, there is provided a method of producing a semiconductor device comprising the steps of: preparing a semiconductor chip which has a first surface and a second surface at opposite sides, and also has a plurality of electrode pads linearly disposed on substantially longitudinal center line of the first surface of the semiconductor chip; placing the semiconductor chip on a first lead frame where a die-pad having a smaller area than the semiconductor chip is formed; bonding the die-pad of the first lead frame and a second surface of the semiconductor chip; positioning a second lead frame, formed by at least one common inner-lead and a plurality of inner leads disposed adjacent to the common inner-lead, above the first surface of the semiconductor chip so as to maintain a gap between the first surface of the semiconductor and a geometric plane determined by the bottom surfaces of the common inner-leads of the plurality of inner leads [to be 0.1 mm or more and 0.4 mm or less]; wire bonding the plurality of electrode pads of the semiconductor chip to corresponding inner leads; and sealing the semiconductor chip, the die-pad, the common inner-leads, and the plurality of inner-leads by filling a resin between the first surface of the semiconductor chip and the second lead frame formed by the common inner-lead and the plurality of inner leads.

DESCRIPTION OF THE PREFERRED EMBODIMENTS

A description of the preferred embodiments of the present invention will now be given in conjunction with the accompanying drawings.

First Embodiment

Figure 1:
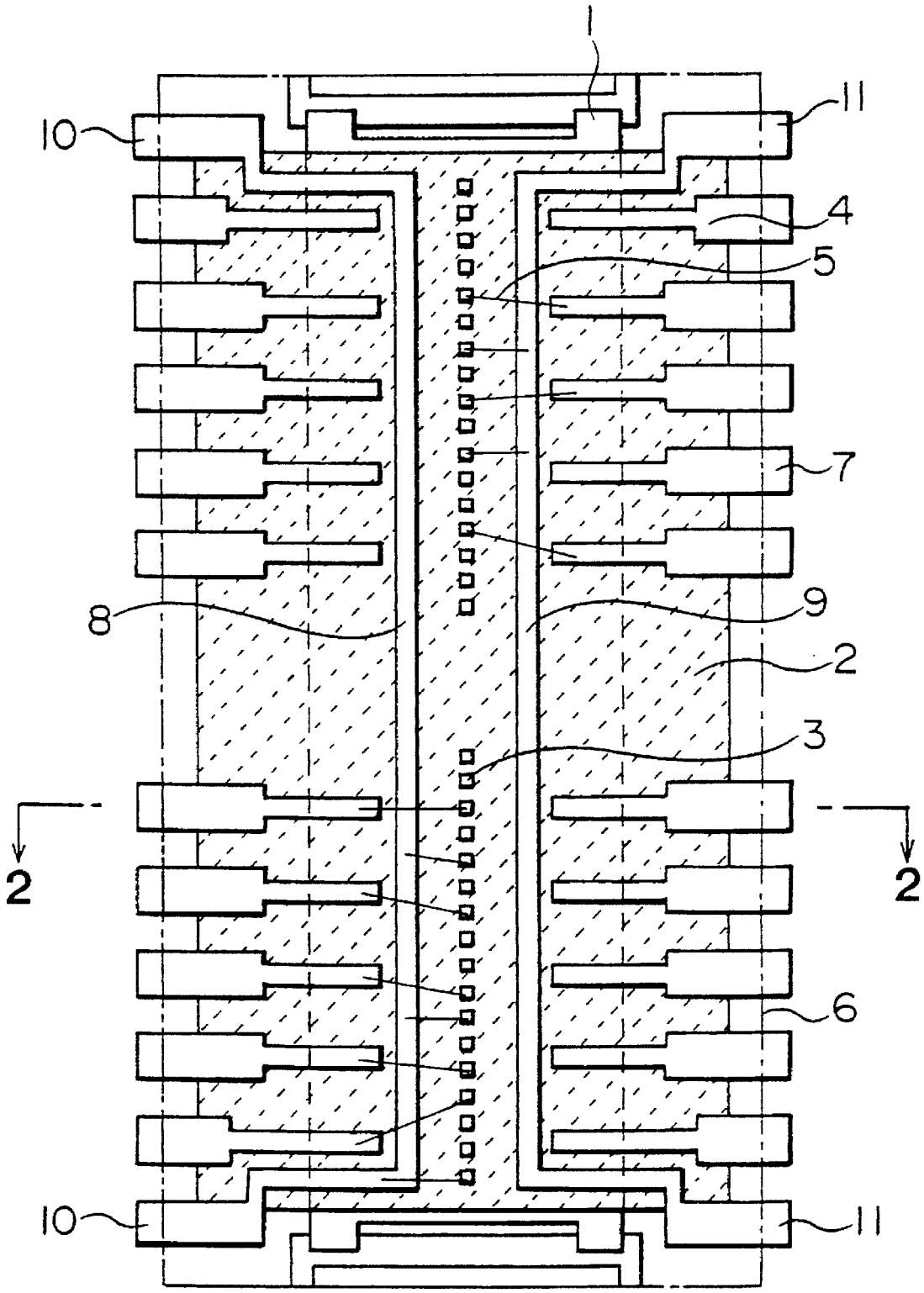
FIG. 1 is a plan view illustrating a semiconductor device relating to a tint embodiment of the present invention.
Figure 2:
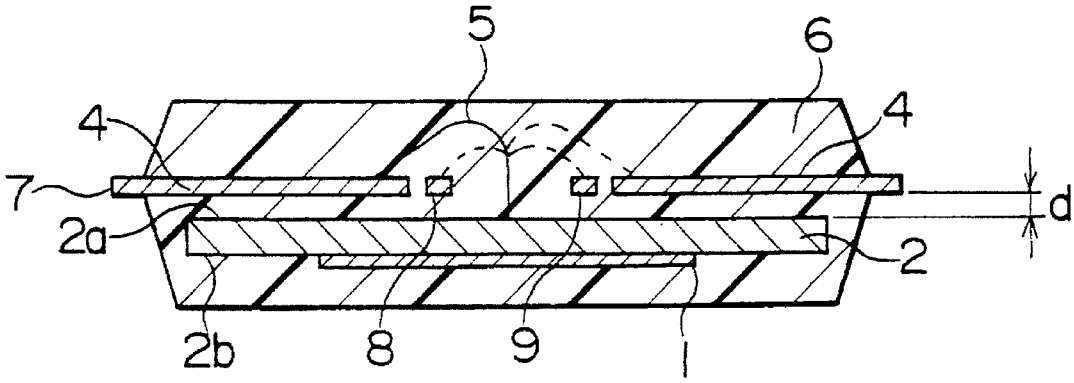
FIG 2 is a sectional view generally taken along the line [A—A] *2—2* of FIG. 1.

FIG. 1 and FIG. 2 are a plan view and a sectional view, respectively, showing a first embodiment of a semiconductor device according to the present invention. A semiconductor chip 2 is formed in a substantially rectangular shape, and has a first surface 2a on which a circuit is formed and also has a second surface 2b opposite the first surface 2a. On the first surface 2a of the semiconductor chip 2, a plurality of electrode pads 3 are linearly disposed adjacent the longitudinal center line of the semiconductor chip 2. The second surface 2b of the semiconductor chip 2 is bonded on a die-pad 1. The die-pad 1 has an area smaller than that of the semiconductor chip 2, and more particularly, is bonded to the chip 2 in a manner such that lateral sides of the die-pad do not outwardly extend from the longitudinal lateral sides of the semiconductor chip 2.

Above the first surface 2a of the semiconductor chip 2, two common inner-leads 8 and 9 are disposed substantially parallel to the longitudinal center-line of the surface 2a and lie between the plurality of the electrode pads 3, and, at the same time, a plurality of inner leads 4 is disposed at a right angle to these corn/non inner-leads leads 8 and 9 outside of the respective common inner-leads adjacent corresponding electrode pads 3. The common inner-leads 8 and 9 are inner leads for supplying supply voltage and for grounding, respectively.

Of the plurality of the electrode pads 3, those which are connected for performing the functions of the semiconductor device are selectively connected electrically to either one of the common inner-leads 8 or 9 or to one of the plurality of the inner leads 4 via respective metallic fine-wires 5. Common outer leads 10 and 11 are integrally connected to the common inner-leads 8 and 9, respectively. The other outer leads 7 are connected with corresponding inner leads 4. Consequently, the die-pad 1, the semiconductor chip 2, the con%mon inner leads 8 and 9, the plurality of inner leads 4, and the plurality of metallic fine-wires 5 are sealed in a body 6 of a resin package made of an epoxy resin or the like, in which the common outer-leads 10 and 11 and the plurality of the outer leads 7 are partially exposed to the outside.

A gap d between the first surface 2a of the semiconductor chip 2 and a geometric plane formed by the bottom surface of the common inner-leads 8 and 9 and the plurality of the inner leads 4 is 0.1 mm to 0.4 min. As shown in FIG. 2, the body 6 of the resin package even fills this gap. Therefore, no insulation tape or the like is inserted in this gap.

Figure 3:
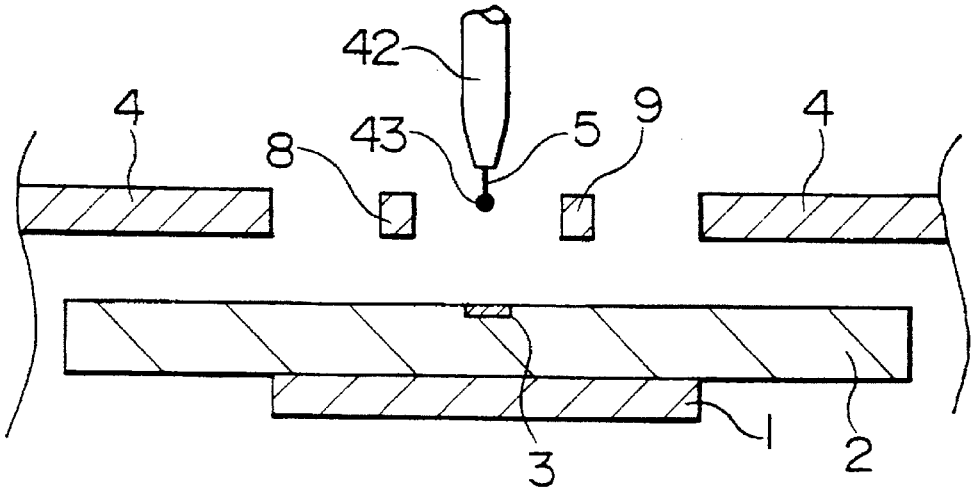
FIG. 3 is a schematic illustration showing a wire-bonding process.
Figure 4:
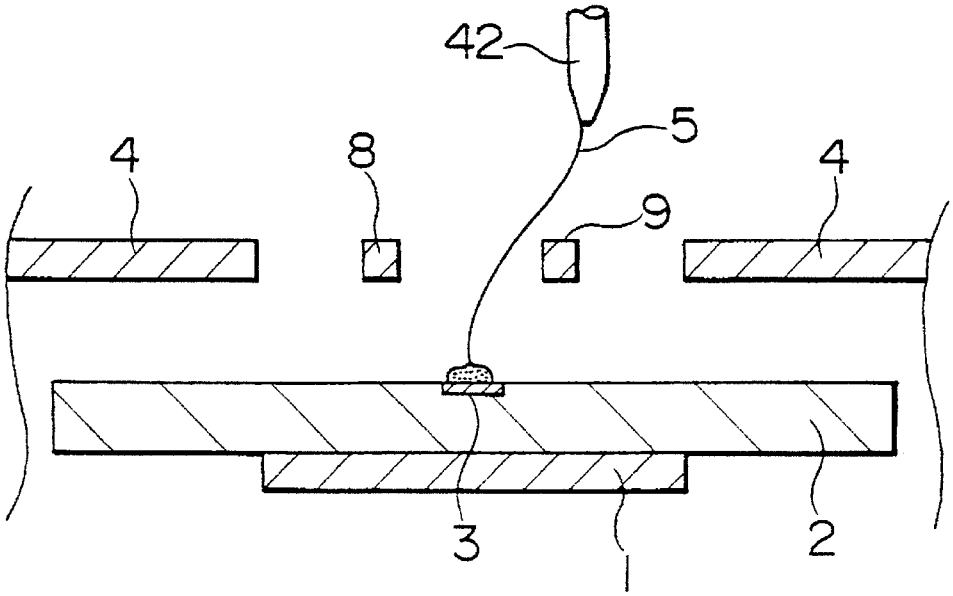
FIG. 4 is a schematic illustration showing a wire-bonding process.
Figure 5:
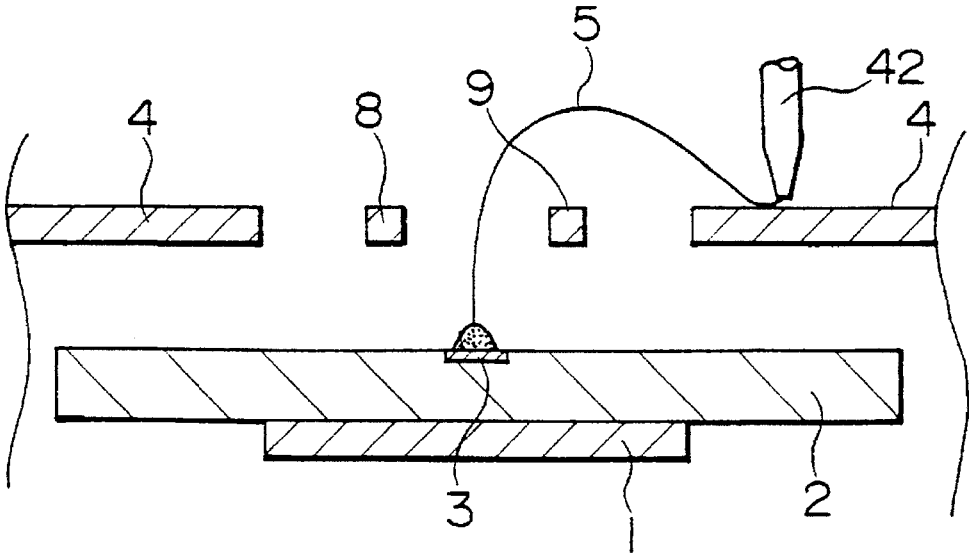
FIG. 5 is a schematic illustration showing a wire-bonding process.

A description of a wire-bonding process for a connection between each electrode pad 3 on the semiconductor chip 2 and each of the plurality of inner leads 4 by means of the metallic fine-wire will be given below in conjunction with FIGS. 3 through 5. Commonly, gold wire having a diameter ranging from 25 μm to 30 μm is used as the metallic fine-wire 5. A point of the metallic fine-wire 5 disposed so as to pass through a capillary chip 42 is heated and melted to form a round ball 43 (shown in FIG. 3). Then, the ball 43, to which a load, heat, and ultrasonic energy are applied, is pressed on to the electrode pad 3 of the semiconductor chip 2 by means of the capillary chip 42. Accordingly, the metallic junction between the metallic ball 43 and the electrode pad 3 is accomplished. In the next step, the metallic fine-wire is fed out from the capillary chip 42 (shown in FIG. 4), and load, heat, and ultrasonic energy are applied to press the metallic fine-wire 5 on the inner lead 4 (shown in FIG. 5) for forming a metallic diffusion junction between the metallic fine-wire 5 and the inner lead 4.

Figure 6:
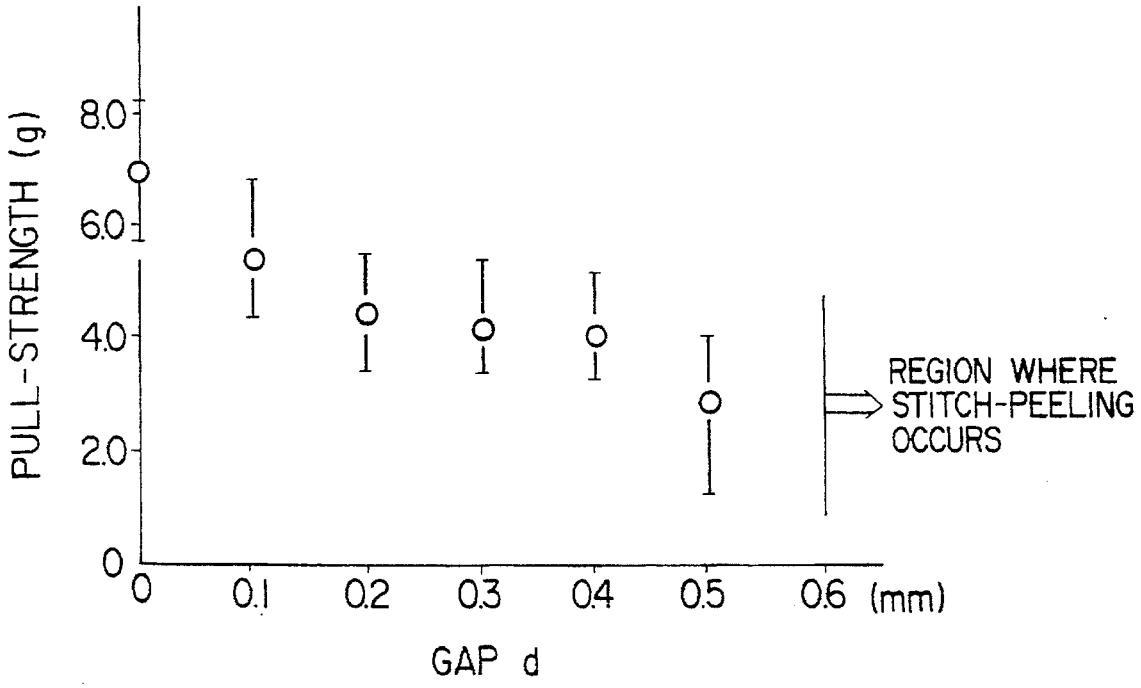
FIG. 6 is a chart showing a relationship between gap d, which represents a clearance between a first surface of a semiconductor chip and an inner lead, and the pull-strength of the inner lead.

An experiment for measuring the pull strength of the metallic fine-wire is executed by disposing the inner lead above a circuit-carrying surface of a 4M-DRAM semiconductor chip of the SOJ-type (small outline J-Bend-type) by providing the gap d therebetween, and then bonding the metallic fine-wire onto the inner lead. The result of the experiment is shown in a chart of FIG. 6, wherein the greater the gap d between the semiconductor chip and the inner lead, the lower the pull strength, and eventually the metallic fine-wire cannot be bonded when the gap d exceeds 0.6 mm or more. In this case, so-called stitch peeling occurs.

Figure 7:
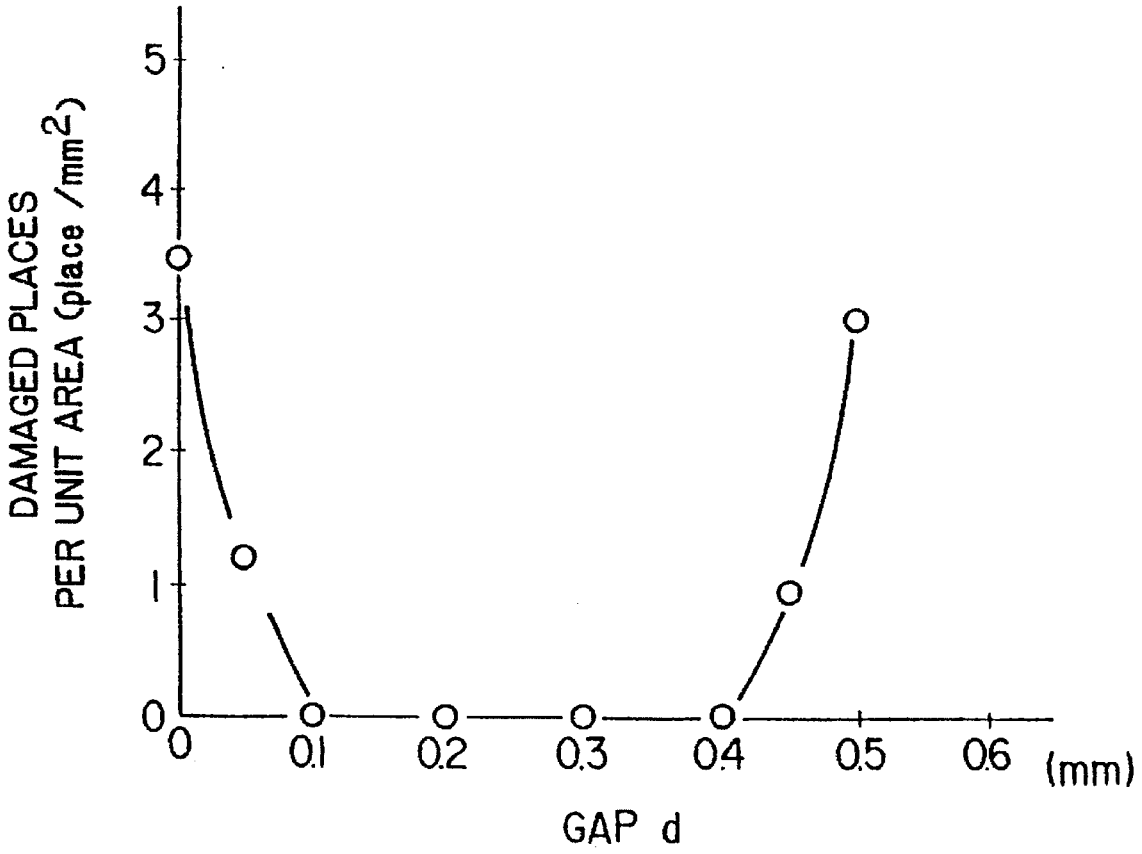
FIG. 7 is a chart showing a relationship between a gap, which represents a clearance between the first surface of the semiconductor chip and the inner lead, and damage which occurred to the semiconductor chip.

Meanwhile, in the above experiment, the frequency of an indentation or damage, on the first surface of the chip and caused by the point of the inner lead during a bonding operation, was measured. The result of this experiment is shown in FIG. 7. The measurement of the frequency of the damage is determined by etching the bonded area of the chip with phosphoric acid and observing the area with an optical microscope to count the number of etch pits, indicating the damage per unit area.

As a result, at least one example of damage was observed when the gap between the semiconductor chip and the inner lead was 0.1 mm or less and 0.4 mm or more, and no damage was observed when the gap ranged between 0.1 mm and 0.4 min.

Accordingly, it is desirable for the inner lead to maintain the gap d between the circuit-carrying surface and the inner lead in a range between 0.1 mm and 0.4 mm in order to achieve stable stitch-bonding without damaging the semiconductor chip.

In the first embodiment of the semiconductor device, a ratio of an area $S_2$ of the semiconductor chip 2 to an area $S_1$ of a plane section of the body 6 of the resin package $S_2/S_1$ was successfully raised to approximately 80%, although the ratio $S_2/S_1$ of the conventional semiconductor chip was approximately 60%. Accordingly, in the embodiment of the present invention, the ratio $S_2/S_1$ is markedly increased such that a large semiconductor chip can be accommodated in a small package.

Figure 8:
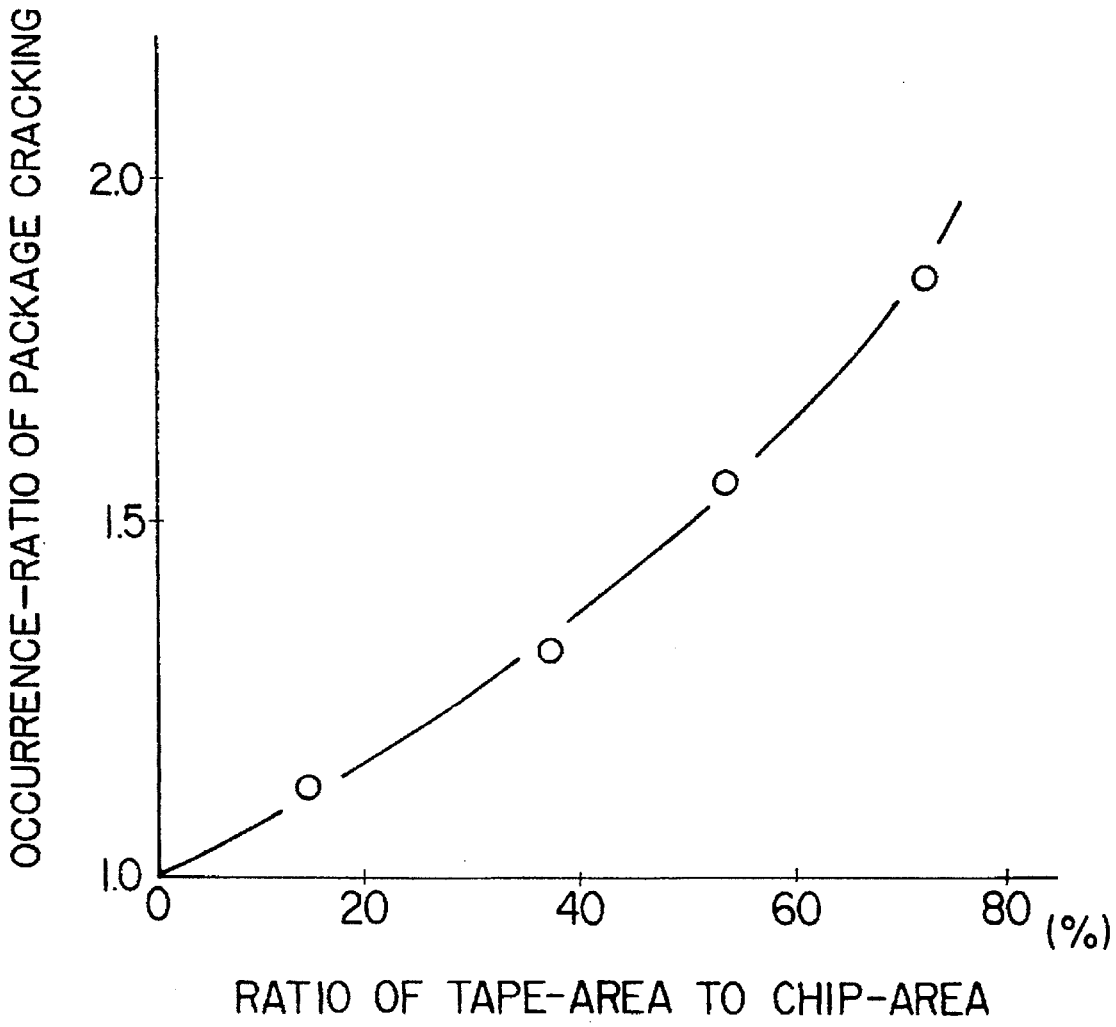
FIG. 8 is a chart showing a relationship between an area-ratio of an insulator to an area of the chip and an occurrence ratio of package cracking.

Meanwhile, for the SOJ package used in the 4M-DRAM, another experiment was executed to observe packing cracking in the semiconductor device. This SOJ package has the same configuration as that of the first embodiment of the device shown in FIGS. 1 and 2, except for a tape-shaped electrical insulator inserted between this circuit-carrying surface of the semiconductor chip and a geometric plane formed by the common inner-leads and the plurality of the inner leads. This semiconductor is subject to preliminary treatment and, then a solder dip to observe any packing cracking. As the preliminary treatment, moisture was applied to the semiconductor device at 85° C. and 85% R. H. By varying the ratio of the area of the tape-shaped insulator to that of the semiconductor, the occurrence of the package cracking was observed. The results are shown in FIG. 8 wherein the ratio of the occurrence of package cracking with insulating tape present to the occurrence of package cracking without insulating tape present is indicated by a value standardized to an area-ratio of zero, i.e., without any tape-shaped insulator between the chip and the leads. As is shown in FIG. 8, the higher the occupancy ratio of the insulator, the higher the occurrence of package cracking. Package cracking causes deterioration of moisture-resistance. When the occupancy ratio of the insulator increases, the moisture-resistant character of the semiconductor device deteriorates. In the present invention, however, the tape-shaped insulator is not placed between the semiconductor chip and the inner leads; hence, a packaged semiconductor device having a superior moisture-resistant character is obtained.

Figure 9:
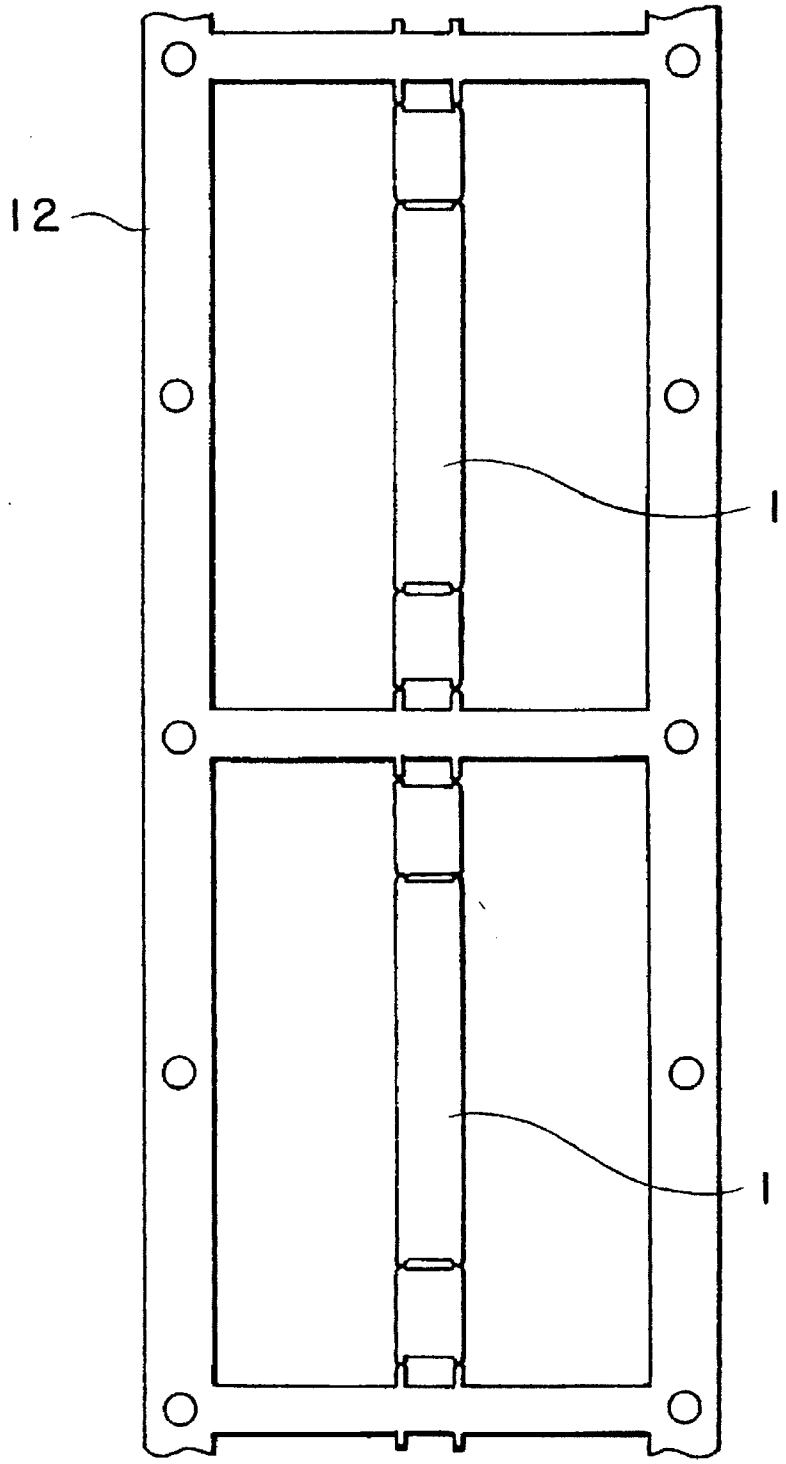
FIG. 9 is a plan view of a first lead frame employed for manufacturing the semiconductor device of the first embodiment.
Figure 10:
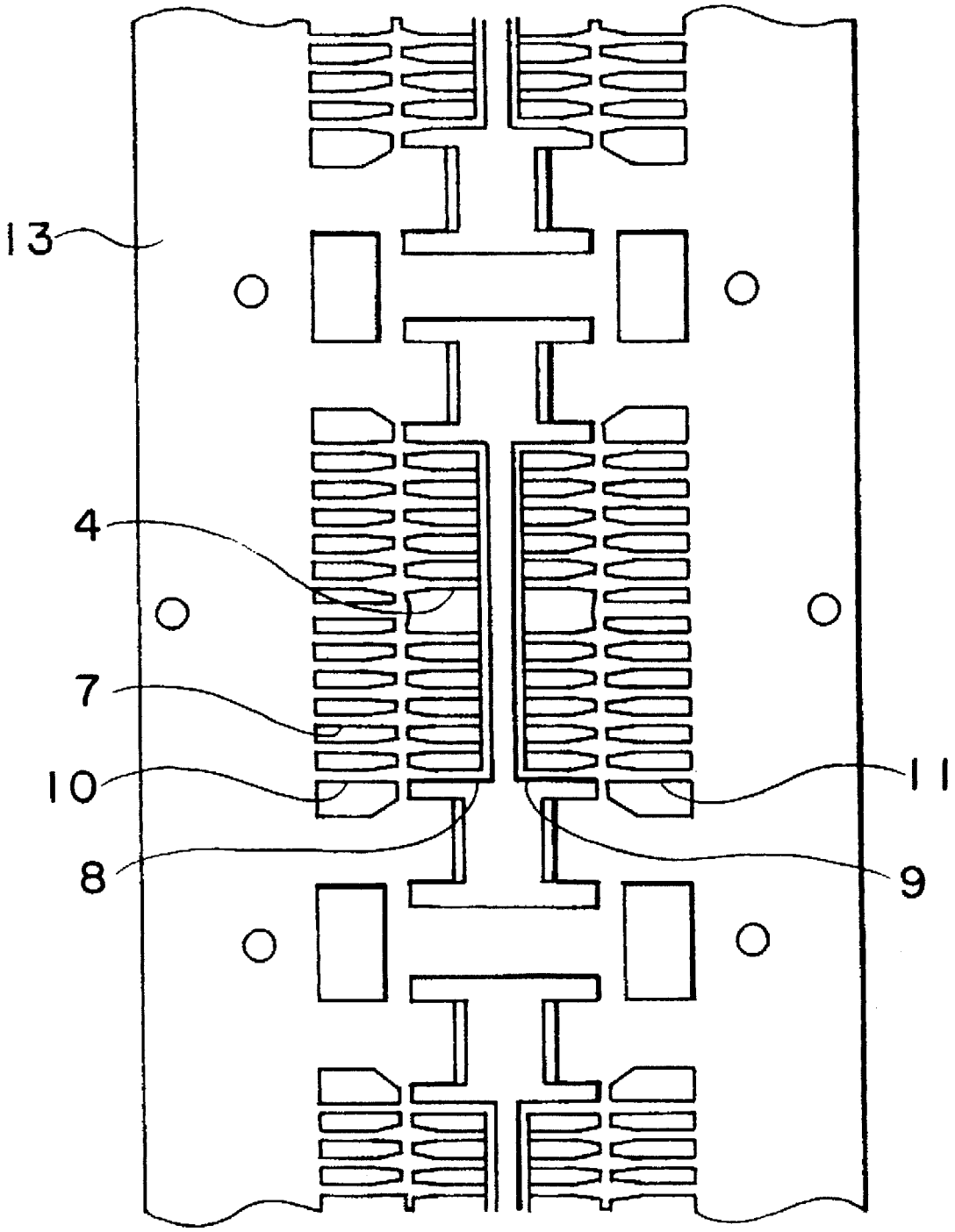
FIG. 10 is a plan view of a second lead frame employed for manufacturing the semiconductor device of the first embodiment.
Figure 11:
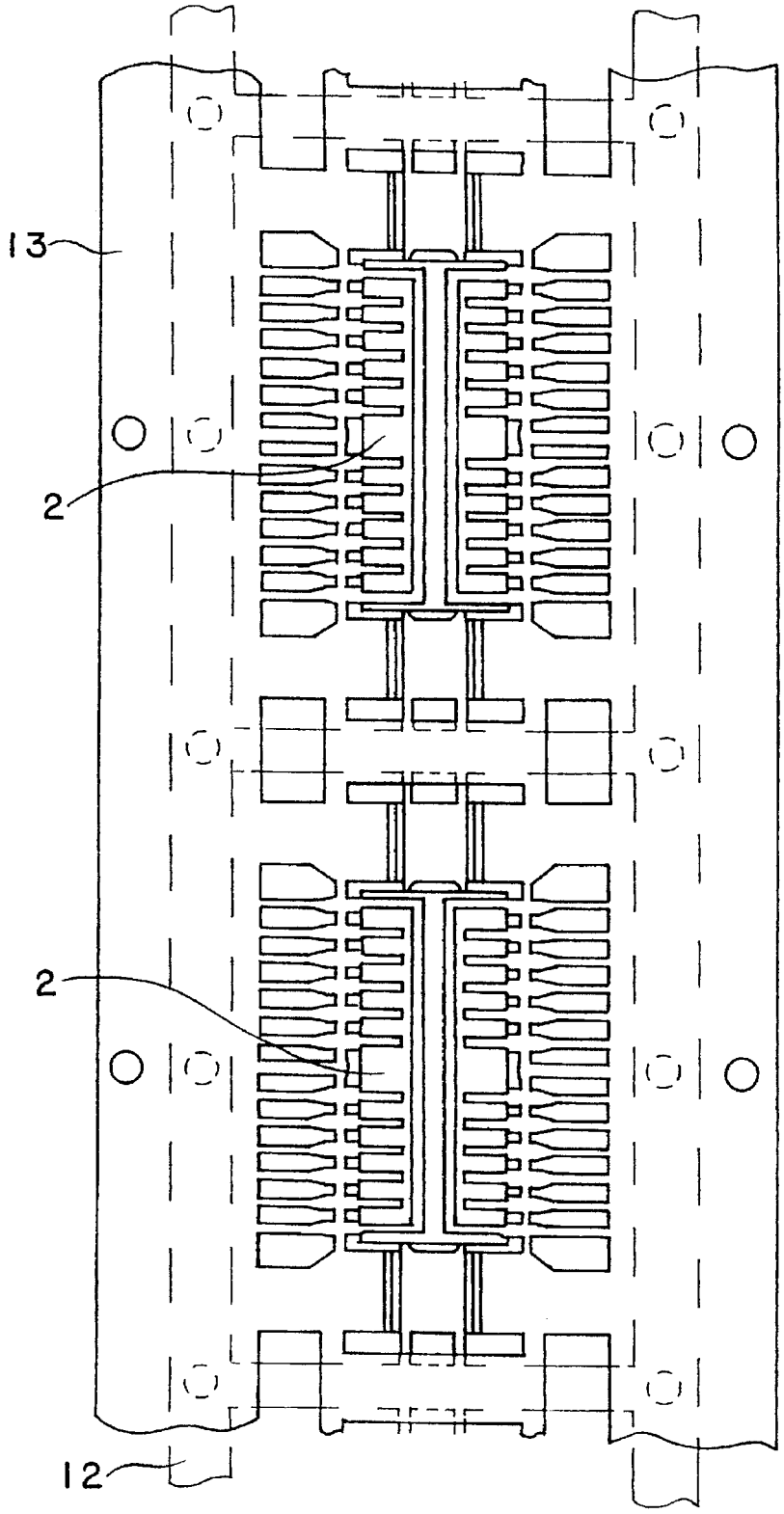
FIG. 11 is a plan view showing the aligned layout of the first lead frame of the FIG. 9 and the second lead frame of the FIG. 10.

The semiconductor device of the first embodiment of the present invention can be manufactured by the following method, for instance. First, the semiconductor chip 2 is carried on a first lead frame 12 where the die-pad 1 is formed as shown in FIG. 9 to bond the second surface 2b of the semiconductor chip 2. Then, a second lead frame 13 shown in FIG. 10 is positioned above the first surface 2a of the semiconductor chip 2 as shown in FIG. 11. The plurality of the inner leads 4, the common inner-leads 8 and 9, the plurality of the outerleads 7, and the common outer-leads 10 and 11 are present in the second lead frame 13. The second lead frame is positioned such that a gap between the first surface 2a of the semiconductor chip 2 and the second lead frame 13, in which the common inner-leads 8 and 9 and the plurality of the inner leads 4 are formed, is 0.1 mm to 0.4 mm. Under the above circumstance while maintaining the gap, the wire-bonding process is executed and, in addition, the resin molding is accomplished, thus the manufacturing of the semiconductor device which is shown in FIG. 1 and FIG. 2 is accomplished.

Figure 12:
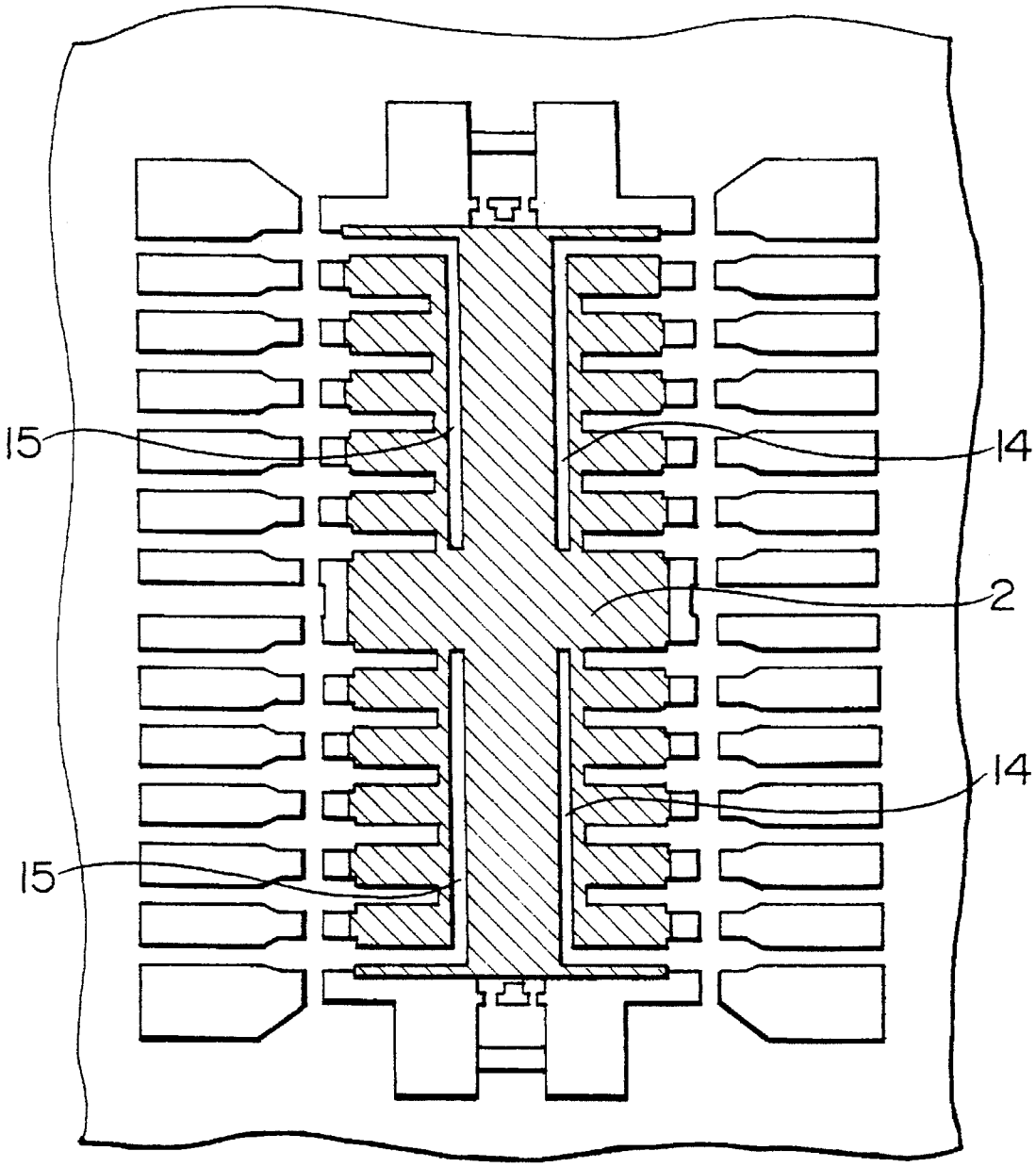
FIG. 12 is a plan view of a modification of the first embodiment.

As is shown in FIG. 12, the common inner-leads 14 and 15 can be disconnected at their respective centers. Due to this configuration, for instance, exclusive common inner-leads can be provided at each circuit block of the semiconductor chip 2, wherein the length of each common inner-lead is shorter; therefore, the response of the signal passing through the common inner-leads 14 and 15 improves and, at the same time, the floating capacitance of these common inner-leads 14 and 15 is reduced.

Figure 13:
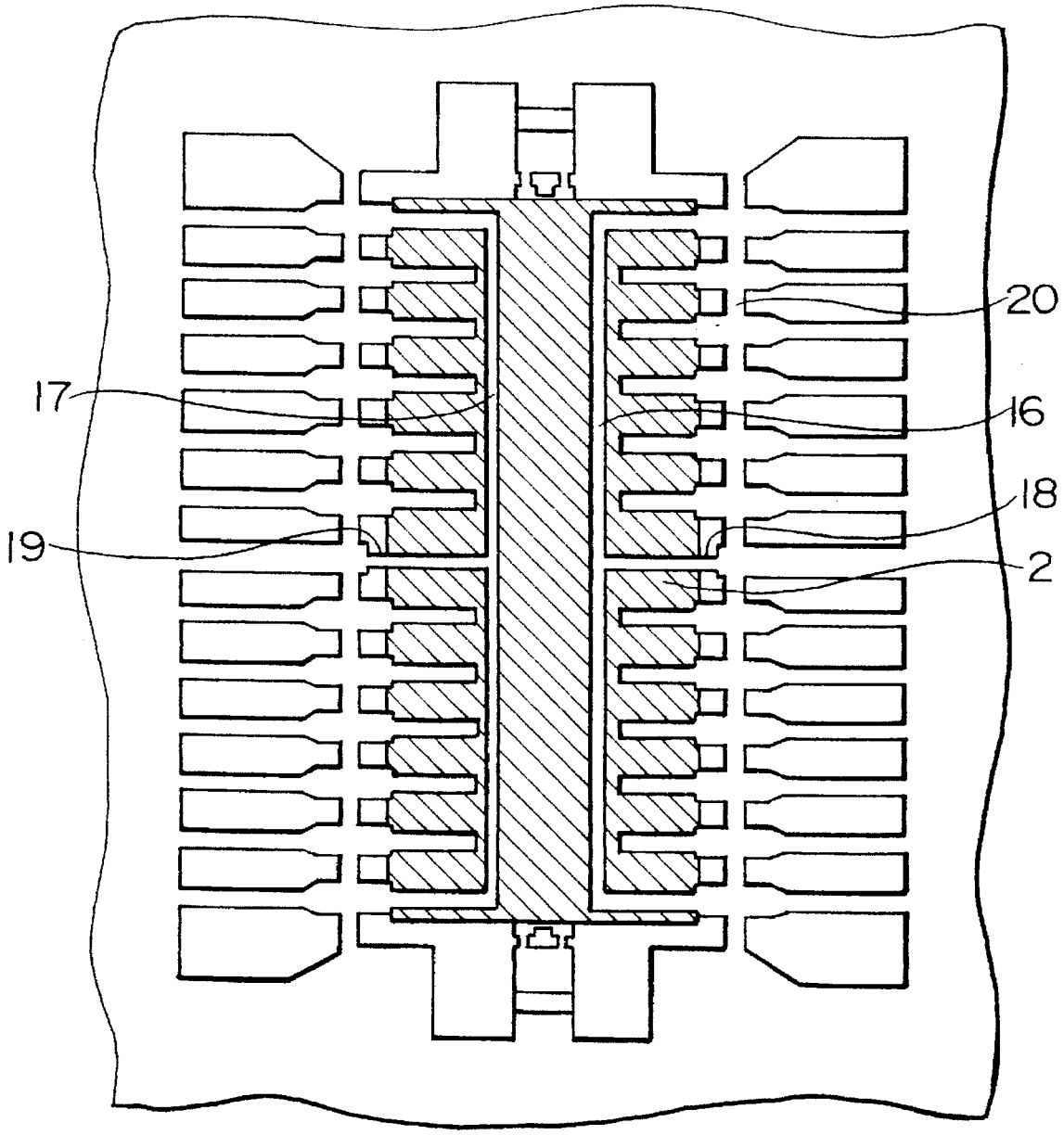
FIG. 13 is a plan view of a modification of the first embodiment.

As shown in FIG. 13, at least one pair of supporting inner-leads 18 and 19 can be connected to each tie-bar 20 from the center of the common inner-leads 16 and 17, which increases the mechanical strength of the common inner-leads 16 and 17 to provide easy bonding and molding.

Figure 14:
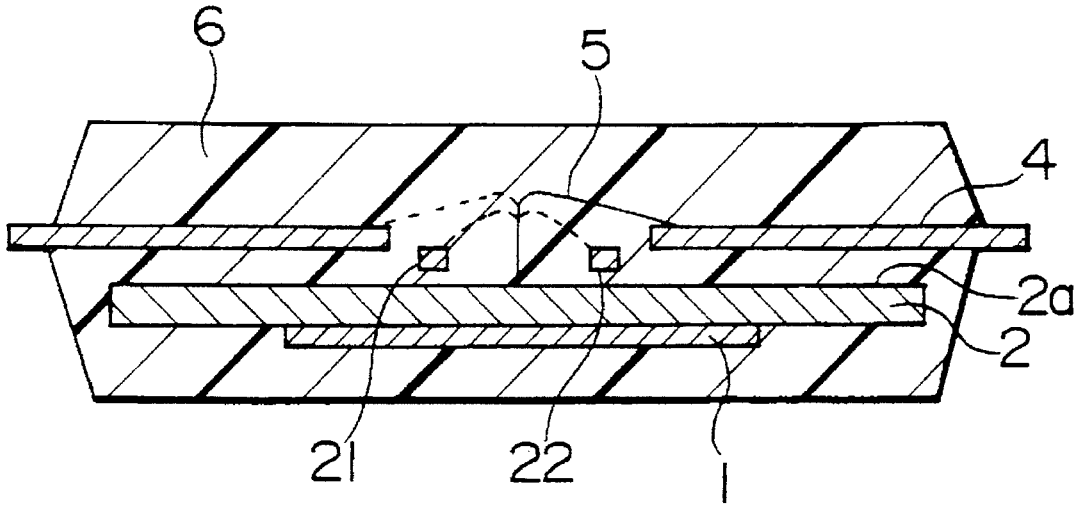
FIG. 14 is a sectional view of a further modification of the first embodiment.

Also, the common inner-leads 21 and 22 can be disposed in a position lower than the plurality of the inner-leads 4 to make smaller the gap between the first surface 2a of the semiconductor chip 2 and the common inner-leads 21 and 22 as shown in FIG. 14, in which, however, the gap between the common inner-leads 21 and 22 and the first surface 2a of the semiconductor chip 2 must be within the range between 0.1 mm and 0.4 mm. Due to this configuration, a short-circuit between the metallic fine-wire 5 connected to each inner lead 4 and the common inner-leads 21 and 22 can be effectively prevented.

Second Embodiment

Figure 15:
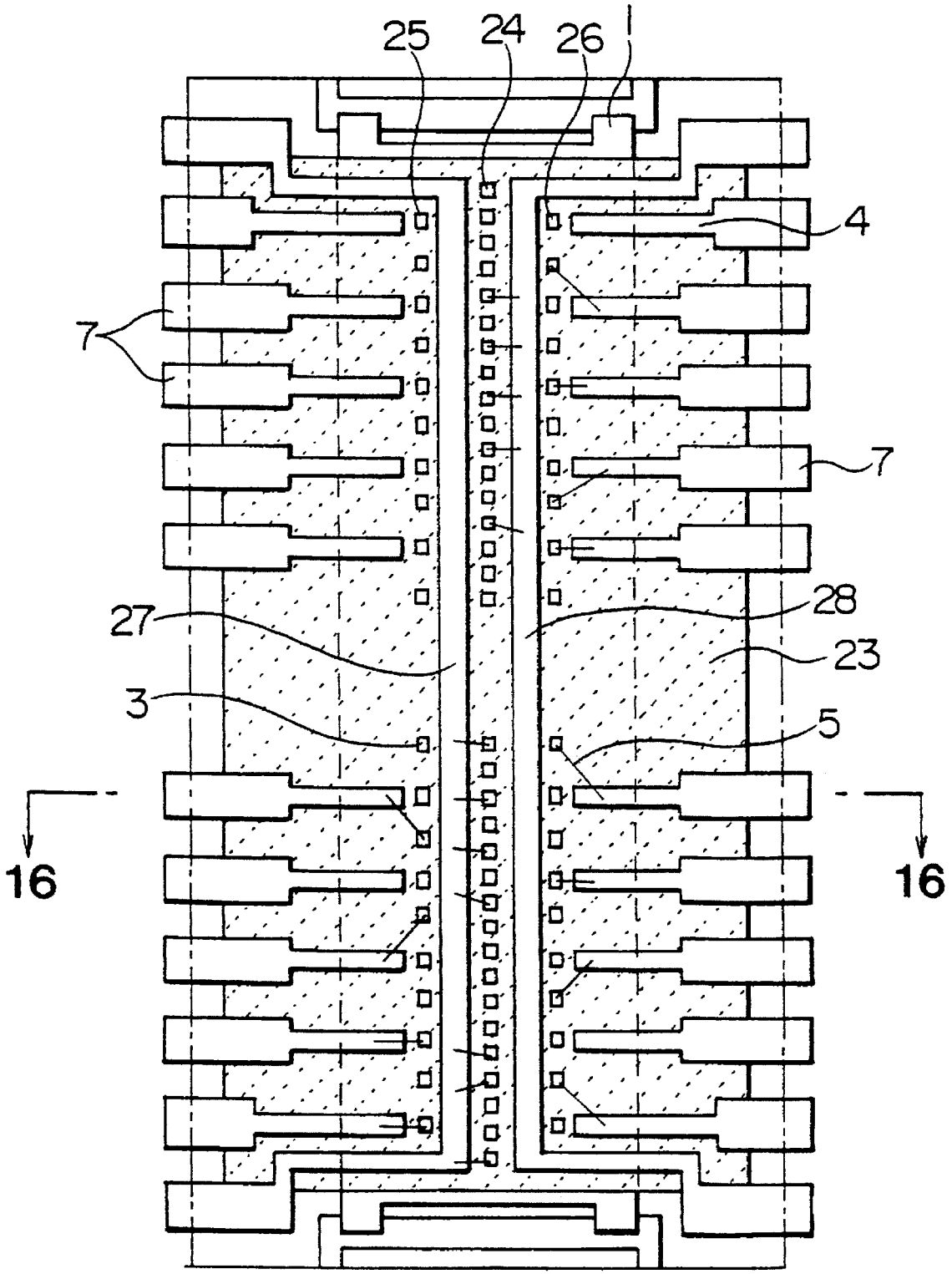
FIG. 15 is a plan view of a semiconductor device which relates to the second embodiment.
Figure 16:
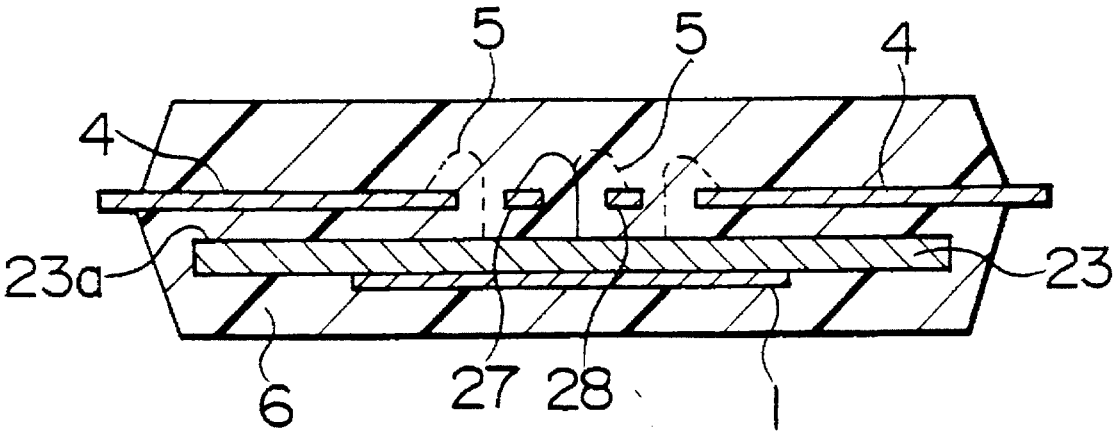
FIG. 16 is a sectional view generally taken along the line [B—B] *2—2* of the FIG. 15.

FIGS. 15 and 16 show a second embodiment of the semiconductor device according to the present invention. On a first surface 23a of the semiconductor chip 23, a first pads-group 24 including a plurality of electrode pads 3 are linearly disposed adjacent to the longitudinal center line. Second and third pads-groups 25 and 26 are each linearly disposed along opposite sides of the first pads-group 24. First and second common-inner leads 27 and 28 are disposed above the first surface 23a of the semiconductor chip 23 and, at the same time, between the first pads-group 24 and the second pads-group 25 and also between the first pads-group 24 and the third pad-group 26. In addition, the plurality of the inner leads 4 are disposed above the first surface 23a of the semiconductor chip 23 and, at the same time, beyond the second pads-group 25 or the third pads-group 26 relative to the center of the first pads-group 24.

Of the plurality of the electrode pads 3 of the first pads-group 24, pads are selectively connected electrically to the common inner-lead 27 or 28 by means of the metallic fine-wires 5. Likewise, of the plurality of the electrode pads 3 of the second and third pads-groups 25 and 26, pads are selectively connected electrically to the plurality of the inner-leads 4, which are adjacently located, by means of the metallic fine-wires 5. Accordingly, the metallic fine-wires connected to the plurality of the inner leads 4 do not pass over the common inner-leads 27 or 28 as shown in FIG. 16, thus surely preventing the occurrence of a short-circuit.

Third Embodiment

Figure 17:
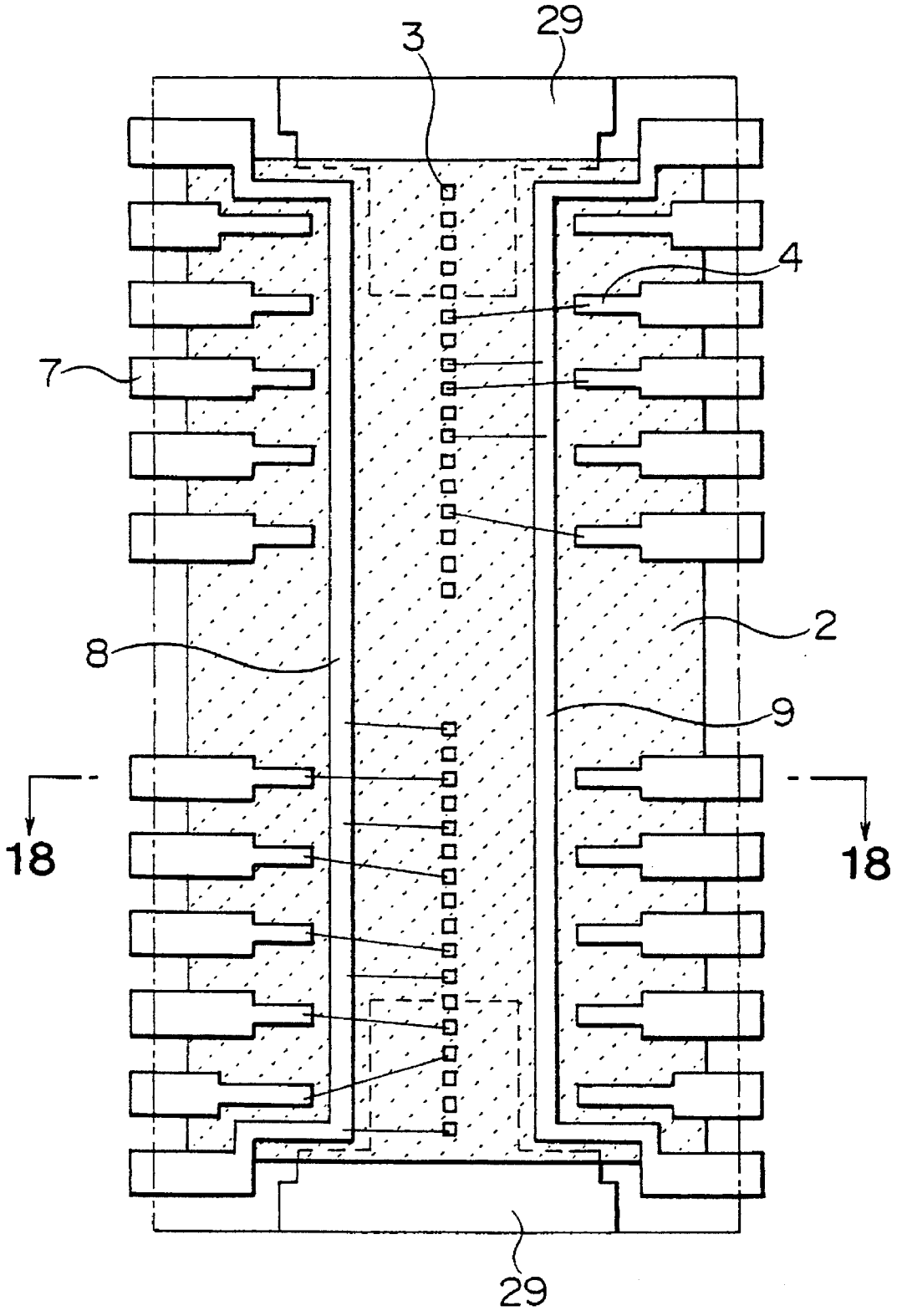
FIG. 17 is a plan view of a semiconductor device which relates to the third embodiment.
Figure 18:
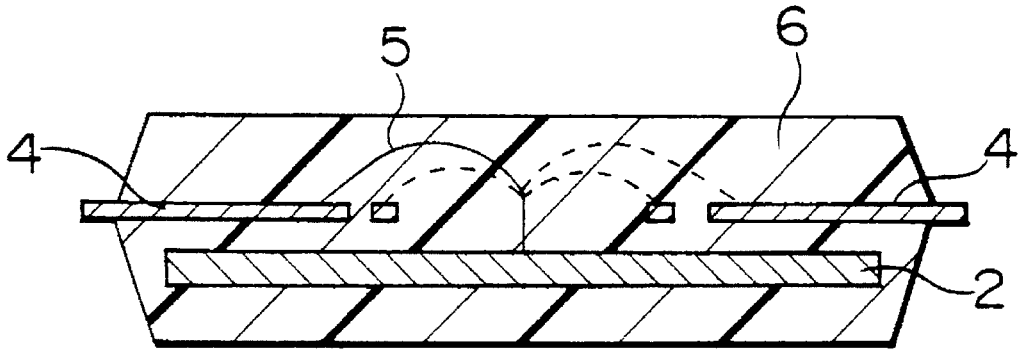
FIG. 18 is a sectional view generally taken along the line [C—C] *18—18* of FIG. 17.

FIGS. 17 and 18 show a third embodiment of the semiconductor device according to the present invention. A pair of die-pads 29 is disposed beneath the longitudinal ends of the semiconductor chip 2. The chip 2 is supported by the pair of the die-pads 29. Also, each die-pad 29 has a planar projections located between the common inner-leads 8 and 9. Due to this configuration of the third embodiment, manufacturing of the semiconductor device is made possible by using one lead frame 55 which comprises the die-pads 29, the common inner-leads 8 and 9, and the plurality of the inner-leads 4.

Fourth Embodiment

Figure 19:
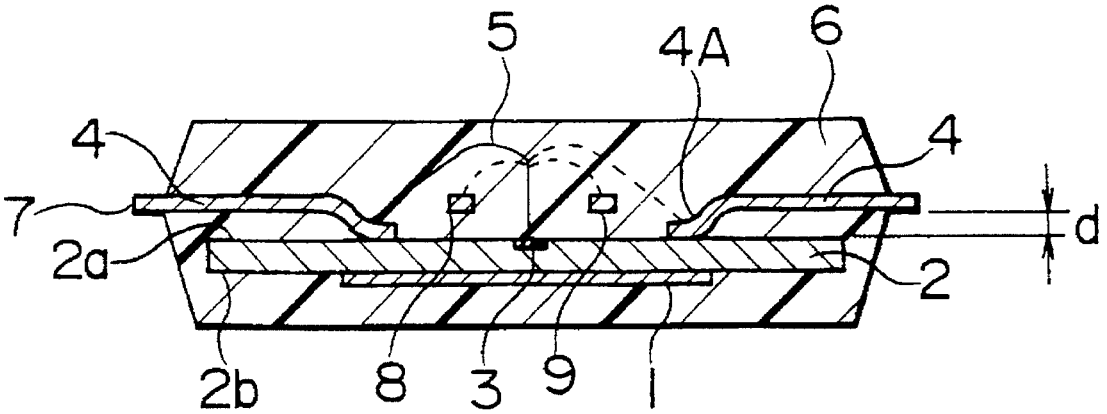
FIG. 19 is a sectional view of a semiconductor which relates to the fourth embodiment.
Figure 20:
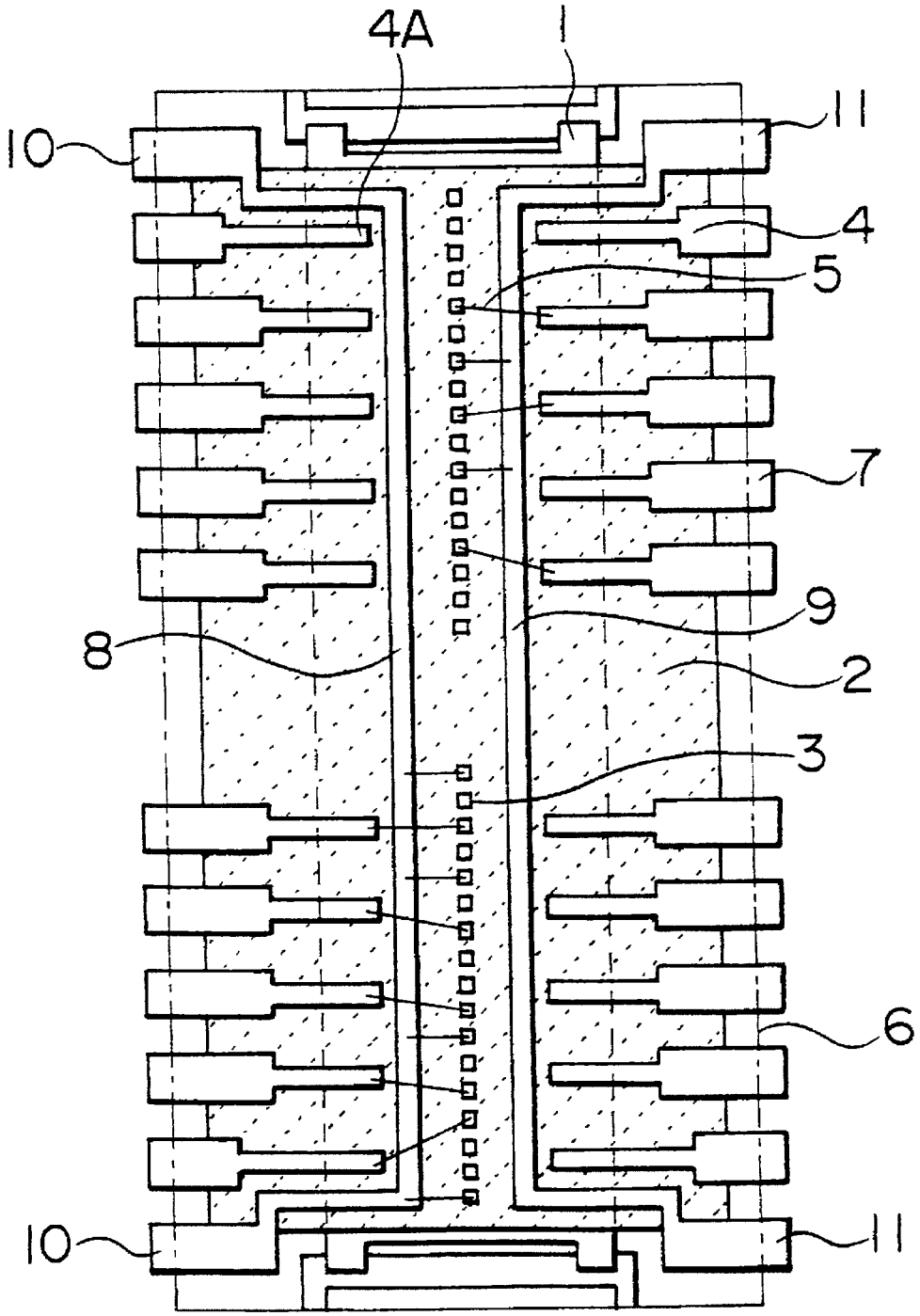
FIG. 20 is a plan view of a semiconductor which relates to the fourth embodiment.

FIGS. 19 and 20 show a fourth embodiment of the semiconductor device according to the present invention. In the fourth embodiment, the second surface 2b of the semiconductor chip 2 is fixedly bonded to the die-pad 1. The electrode pads 3 on the first surface 2a of the semiconductor chip 2 and the inner leads 4 are connected by respective metallic fine-wires which pass over one of the common inner-leads 8 or 9. The end portion 4A of each inner lead 4 is bent to ground the first surface 2a of the semiconductor chip 2. The die-pads 1, the semiconductor chip 2, the common inner-leads 8 and 9, and the plurality of the metallic fine-wires 5 are sealed in the body 6 of the package made of the epoxy resin and the like such that the plurality of the outer leads 7 are exposed outside of the body 6. Although the area of the die-pad 1 is smaller than that of the second surface 2b of the semiconductor chip 1 as shown in FIG. 19, it is acceptable if the area of the die-pad 1 is larger than that of the second surface 2b.

Figure 21:
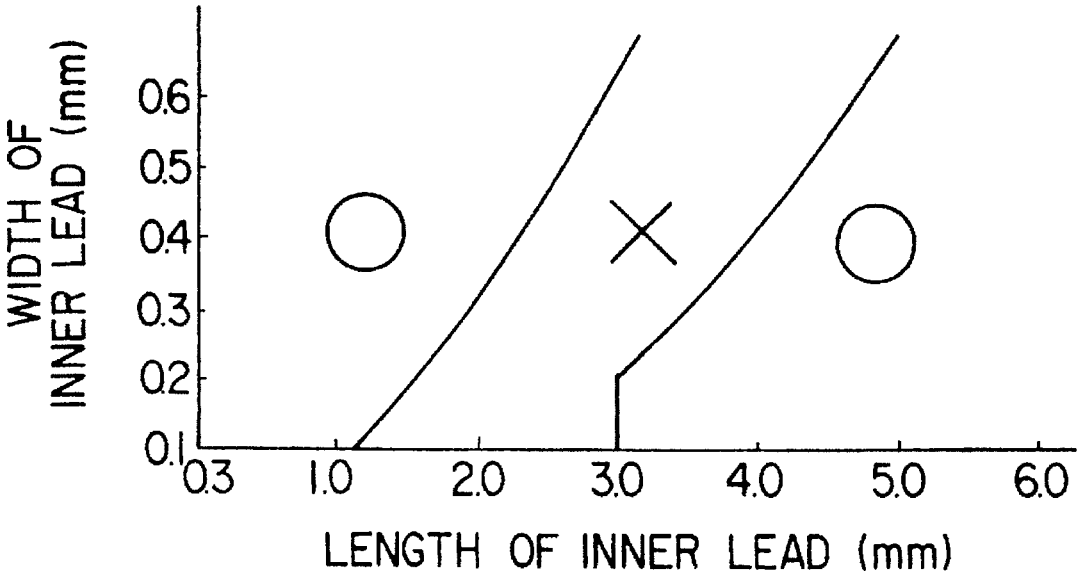
FIG. 21 (PRIOR ART)
FIG. 21 is a chart showing the relationship between a bonding-possibility and the shape of the inner lead of a semiconductor device of the prior art.
Figure 22:
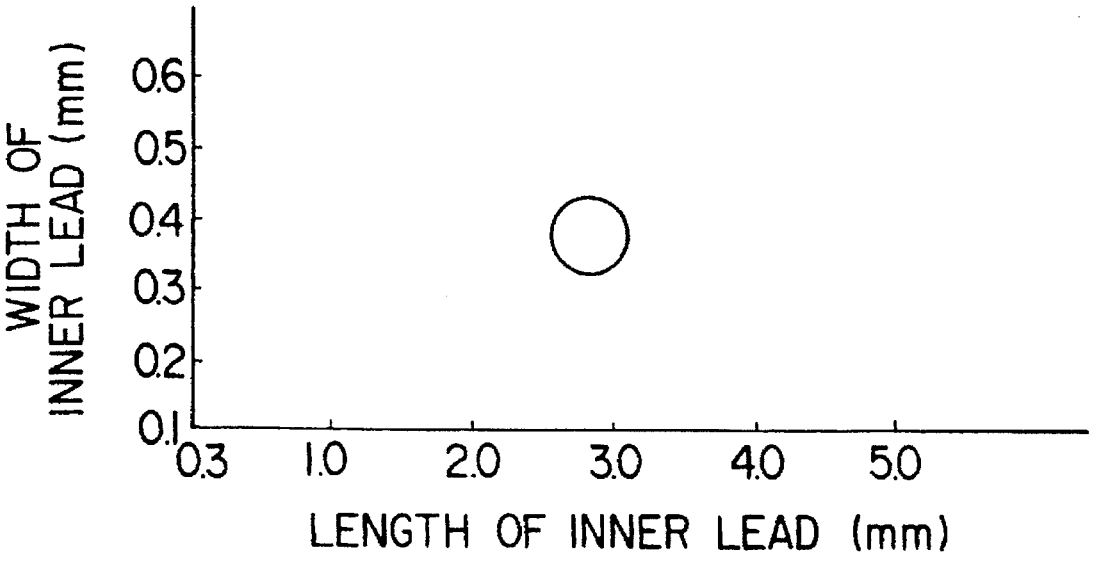
FIG. 22 is a chart showing the relationship between bonding-possibility and the shape of the inner lead of a semiconductor device of the present invention.

The relationship between acceptable and unacceptable shapes of the inner lead 4 for bonding, if the gap d (designated as hollow distance) between the inner lead 4 and the first surface 2a of the semiconductor chip 2 shown in FIG. 19 is 0.4 mm, is illustrated in FIGS. 21 and 22 of the prior art and the present invention respectively.

In these FIGS. 21 and 22, the abscissa and the ordinates represent the length and the width of the inner leads respectively, and the mark 0 or circle indicates an acceptable region for bonding and the other mark X indicates an unacceptable region for bonding. In this case, the thickness of the inner lead was 0.2 mm, and conditions for bonding were ordinary ones.

It can be found from FIG. 21 of the configuration of the prior art that an unacceptable region for bonding exists near the center of the lead length ranging between 0.3 mm and 6.0 mm applied in the experiment. Therefore, a restriction must be made when designing the shape of the inner lead.

On the contrary, it can be found from FIG. 22 of the present invention that all the region of the length (0.3 to 6.0 mm) and of the width (0.1 to 0.6 mm), where the experimentation was executed, was acceptable for bonding. Furthermore, it has been also recognized from the result of the measurement that the value of the strength of the bonded area is satisfactory in the overall region where the experimentation was executed.

When there is a hollow portion under the inner lead 4, there is a defect such that a resonance of the inner lead 4 will occur in response to ultrasonic energy and, thus, some ultrasonic energy is not effectively used for the bonding due to the resonance. Therefore, the metallic fine-wire 5 cannot be bonded because of the shape of the inner lead 4, thus deteriorating the bonding characteristic. This problem can be overcome by the method introduced in the fourth embodiment.

Fifth Embodiment

Figure 23:
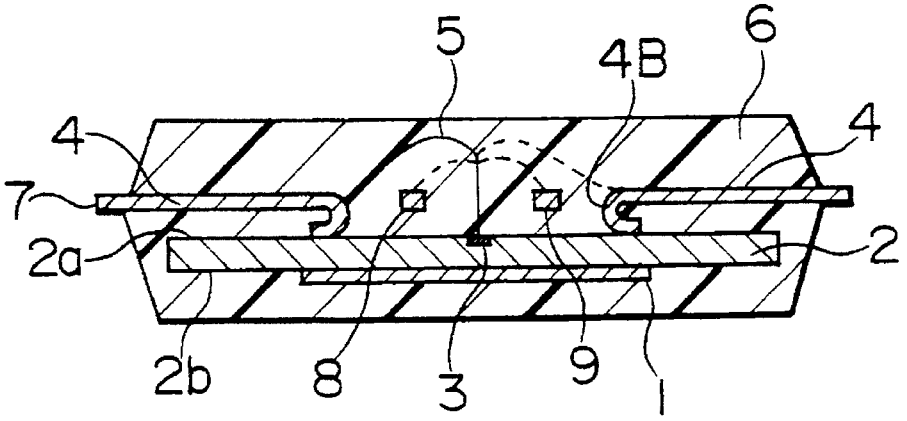
FIG. 23 is a sectional view of a semiconductor which relates to a fifth embodiment.
Figure 24:
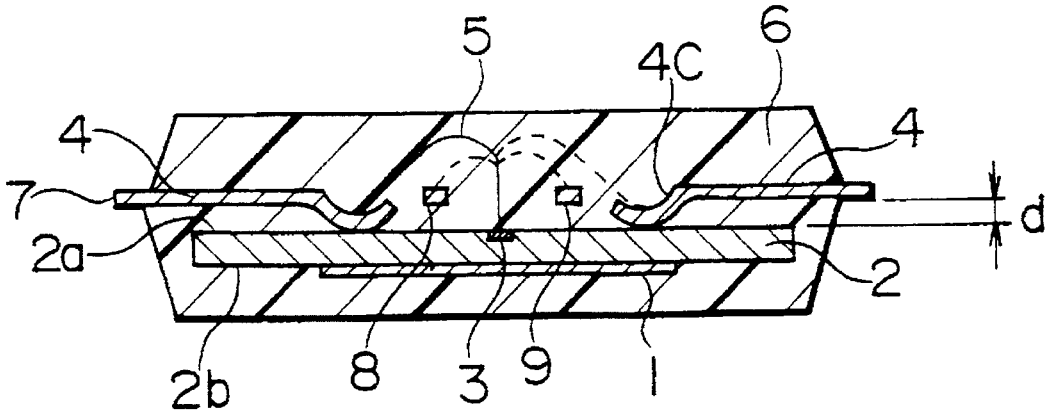
FIG. 24 is a sectional view of a modification of the fifth embodiment.

In the above mentioned fourth embodiment, the end portion of the inner lead is bent into the shape (gull-wing shape) indicated in FIG. 19 to form a tip-end portion 4A which grounds the first surface 2a of the semiconductor chip 2. However, the same effect can be obtained when the end portion of the inner lead 4 is bent into the shape (the letter-J shape) illustrated in FIG. 23 to form a spoon-end portion 4B which grounds the first surface 2a of the semiconductor chip 2. In addition, as shown in FIG. 24, the end portion of the inner lead 4 can be bent into a multi-step shape to form a tip-end portion 4C.

Sixth Embodiment

Figure 25:
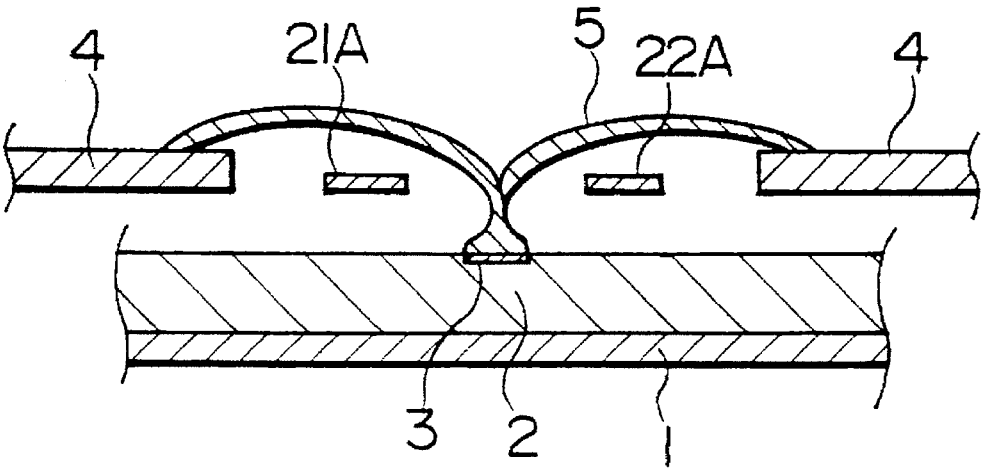
FIG. 25 is a sectional view of a portion of a semiconductor device which relates to a sixth embodiment.

In the foregoing first embodiment of the semiconductor device shown in FIG. 14, the common inner-leads 21 and 22 are disposed in a lower position than the plurality of the inner leads 4 to prevent a short-circuit from occurring between the metallic fine-wires 5 and the common inner-leads 21 or 22. However, thinner common inner-leads 21A and 22A also can be employed as shown in FIG. 25. For example, when the thickness of the inner lead 4 is 0.2 mm, that of the common inner-leads 21A and 22A can be preferably 0.08 mm or more and 0.15 mm or less, most preferably 0.125 mm. In addition, the common inner-leads 21A and 22A can be disposed in a position much closer to the inner leads 4.

Seventh Embodiment

Figure 26:
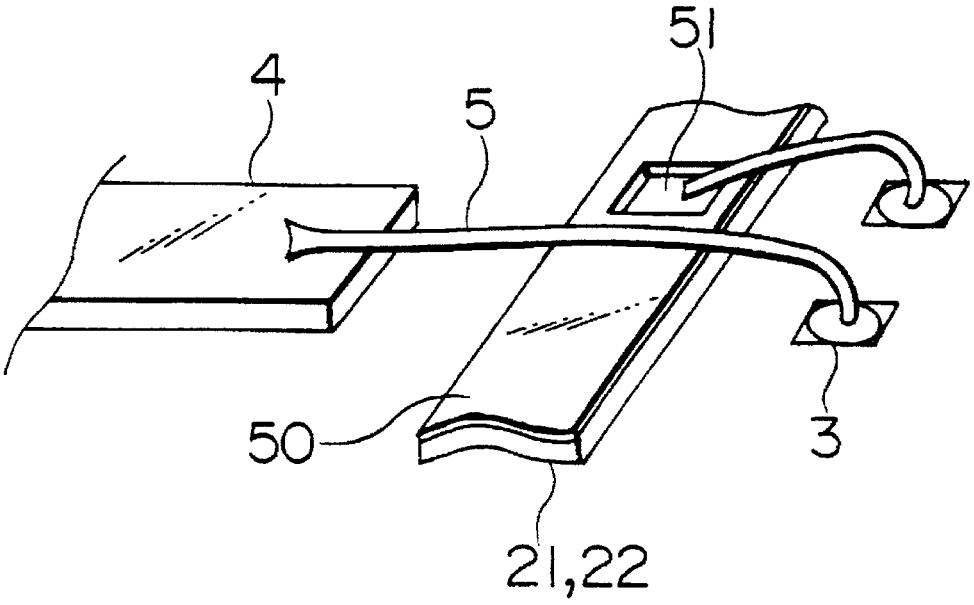
FIG. 26 is a perspective view of a portion of a semiconductor device which relates to a seventh embodiment.

In the sixth embodiment, thinner common inner-leads 21A and 22A were used; however, as shown in FIG. 26, an insulating film 50 such as polyimide insulating-tape can be adhered to the surface of the common inner-leads 21 and 22, thus providing a configuration in which the metallic fine-wires S can contact the common inner-leads 21 or 22. In the above configuration, the height or the gap between the common inner-leads 21 and 22 and the semiconductor chip 2 can be freely set in a wide range. To enable bonding the metallic fine-wires 5 to the common inner-leads 21 or 22, an opening 51 is provided by locally removing the insulating film where the bonding is to be done.

Eighth Embodiment

Figure 27:
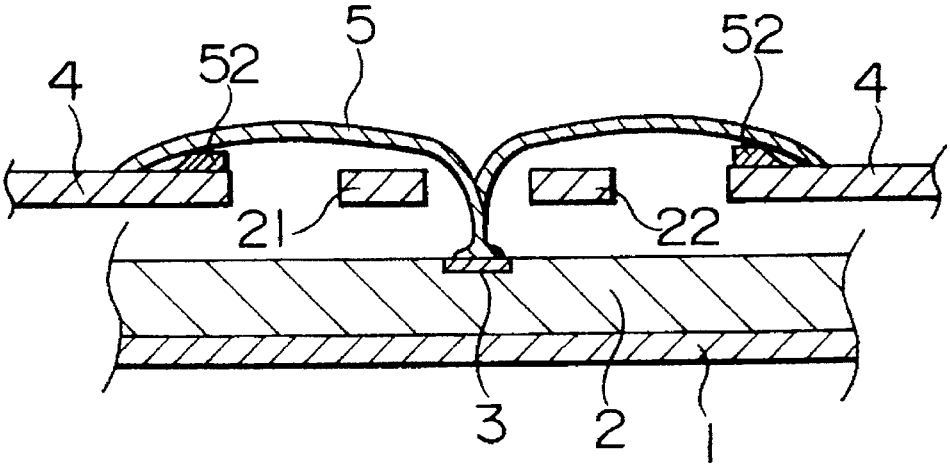
FIG. 27 is a sectional view of a portion of a semiconductor device which relates to a eighth embodiment.

In the sixth embodiment, the thinner common inner-leads 21A and 22A are employed: however, as shown in FIG. 27, a block 52 or the like can be provided on each end portion of the inner leads 4 so as to increase the substantial height or gap of each inner leads 4 to the common inner-leads 21 and 22. Accordingly, a short-circuit between the metallic fine-wires S and the common inner-leads 21 or 22 can be effectively prevented due to this configuration.

Ninth Embodiment

Figure 28:
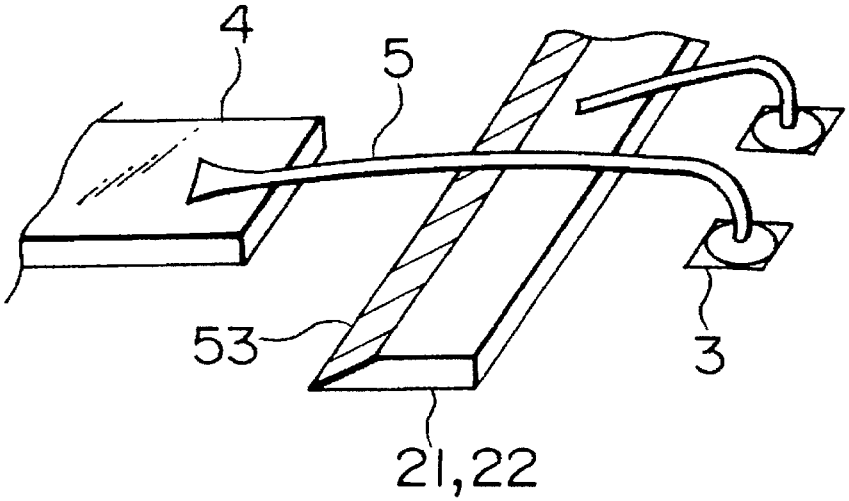
FIG. 28 is a perspective view of a portion of a ninth embodiment.
Figure 29:
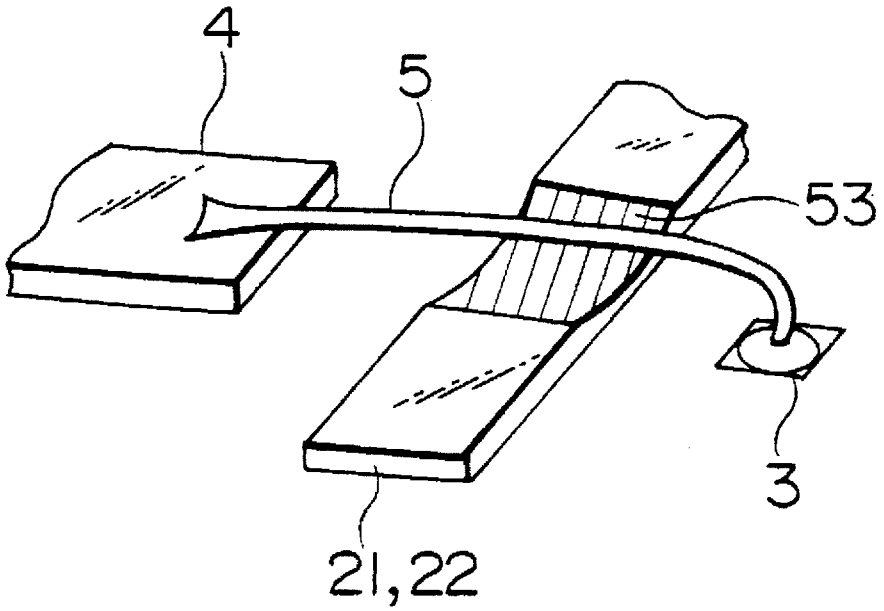
FIG. 29 is a perspective view of a modification of the ninth embodiment.
Figure 30:
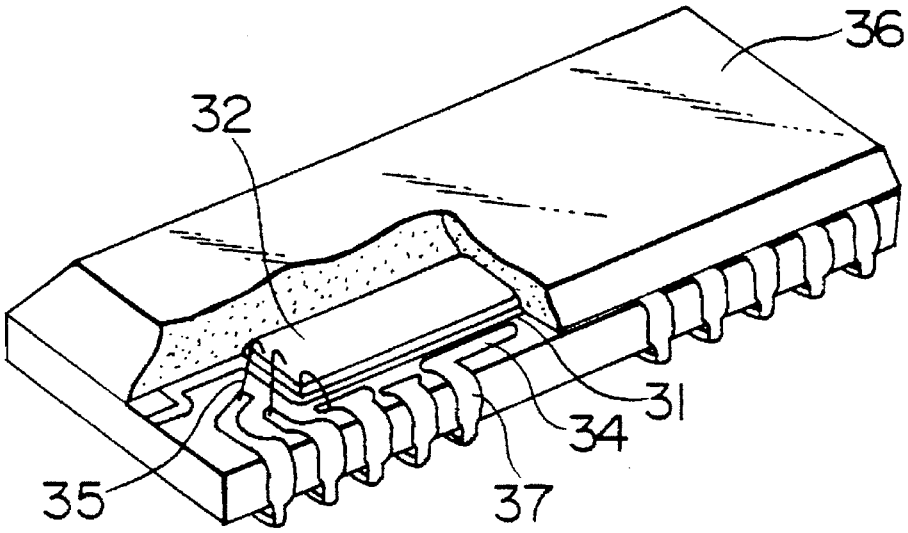
FIG. 30 PRIOR ART
FIG. 30 is a partially cut-away perspective view of a semiconductor of the prior art.
Figure 31:
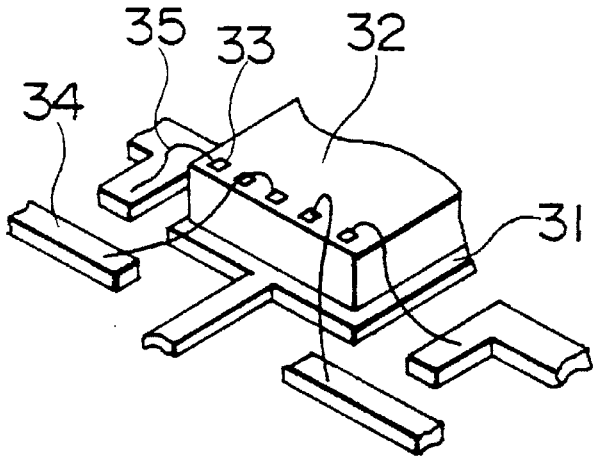
FIG. 31 PRIOR ART
FIG. 31 is an enlarged view of a portion of the semiconductor device of the prior art.

FIGS. 28 and 29 illustrate a ninth embodiment of the present invention in which a modification is applied to the common inner-leads. In FIG. 28, each corner portion of the common inner-leads 21 and 22, the corner being closer to the adjacent inner lead, is chamfered to form a chamfered portion 53. The chamfered portion 53 can also be provided on the opposite side of the above mentioned corner of the common inner-leads 21 and 22.

In addition, in FIG. 29, an area where each metallic fine-wire S gets closer to the common inner-leads 21 or 22, when they are crossing each other, is locally cut out by etching or the like to make thinner a cut-off portion 53. In this configuration, the short-circuit between the common inner-leads 21 or 22 and the metallic fine-wires 5 can be as effectively prevented as in the foregoing eighth embodiment.

What is claimed is:

1. A semiconductor device comprising:

a semiconductor chip having a first surface, an opposed second surface, and a plurality of electrode pads linearly disposed substantially on a longitudinal center line of the first surface of said semiconductor chip;

a die-pad bonded to the second surface of said semiconductor chip to support the chip and having a smaller area than said semiconductor chip;

at least one common inner-lead disposed opposite and spaced from the first surface of said semiconductor chip and substantially parallel to the longitudinal center line;

a plurality of inner leads disposed adjacent to corresponding electrode pads opposite and spaced from the first surface of said semiconductor chip;

a plurality of metallic wires electrically connecting respective electrode pads with one of the common inner-lead and the corresponding inner lead;

a resin package encapsulating said semiconductor chip, said die-pad, said common inner-lead, said plurality of inner leads, and said plurality of wires;

at least one common outer-lead integrally connected with said common inner-lead and exposed outside said resin package; and a plurality of outer leads, each outer lead being unitary with a corresponding inner lead and exposed outside said resin package wherein said common inner-lead and said plurality of inner leads are spaced from the first surface of said semiconductor chip by a gap ranging from 0.1 mm to 0.4 mm and the gap is filled with resin that is part of said resin package.

2. The device as defined in claim 1 wherein said common inner-lead is divided at a center of said longitudinal center line into two sections.

3. The device as defined in claim 1 including at least one supporting inner-lead connected centrally to each common inner-lead for supporting the respective connected common inner-lead.

4. The device as defined in claim 1 wherein the gap between the first surface of said semiconductor chip and said at least one common inner-lead is not greater than the gap between the first surface of the chip and said plurality of inner leads.

5. The device as defined in claim 1 including a die-pad located adjacent to each longitudinal end of said semiconductor chip.

6. The device as defined in claim 1 wherein each inner lead includes an end bent to contact and contacting said semiconductor chip.

7. The device as defined in claim 1 including an insulating film disposed directly on each of said common inner-leads, said insulating film being interposed between each of said common inner-leads and said wires.

8. The device as defined in claim 1 including a block on each of said inner leads to prevent said wires from contacting said at least one common inner-lead.

9. The device as defined in claim 1 including a chamfered portion on each common inner-lead adjacent to said inner leads.

10. The device as defined in claim 1 including a recess in each common inner-lead where one of said wires crosses said common inner-lead.

11. A semiconductor device comprising:

a semiconductor chip having a first surface, an opposed second surface, a first pad-group including a plurality of electrode pads linearly disposed substantially on a longitudinal center line of the first surface of said semiconductor chip, and second and third pad-groups, each including a plurality of electrode pads linearly disposed on opposite sides of the first pad-group;

a die-pad bonded to the second surface of said semiconductor chip to support the chip and having a smaller area than said semiconductor chip;

first and second common inner-leads disposed opposite and spaced from the first surface of said semiconductor chip and disposed on opposite sides of the first pad-group between the second and third pad-groups:

a plurality of inner leads spaced from and opposite the first surface of said semiconductor chip beyond the second and third electrode-pad groups;

a plurality of metallic wires electrically connecting each first electrode pad with a corresponding one of the first and second common inner-leads and electrically connecting respective pads of the second and third pad-groups with corresponding inner leads;

a resin package encapsulating said semiconductor chip, said die-pad, the first and second common inner-leads, said plurality of inner leads, and said plurality of wires;

first and second common outer-leads respectively integrally connected with the first and second common inner-leads and each exposed outside said resin package; and a plurality of outer leads, each outer lead being unitary with a corresponding inner lead and exposed outside said resin package wherein the first and second common inner-leads and said plurality of inner leads are spaced from the first surface of said semiconductor chip by a gap ranging from 0.1 mm to 0.4 mm and the gap is filled with resin that is part of said resin package.

12. A method of producing a semiconductor device comprising the steps of:

preparing a semiconductor chip which has a first surface, a second surface opposite the first surface and a plurality of electrode pads linearly disposed on a longitudinal center line of the first surface of said semiconductor chip;

placing said semiconductor chip on a first lead frame having a die-pad smaller in area than said semiconductor chip;

bonding said die-pad of the first lead frame and a second surface of said semiconductor chip;

positioning a second lead frame, including at least one common inner-lead and a plurality of inner leads disposed adjacent to said common inner-lead, opposite and spaced from said tint surface of said semiconductor chip to maintain a gap between the first surface of said semiconductor chip and said common inner-lead and said plurality of inner leads of 0.1 mm to 0.4 mm;

wire-bonding each of said plurality of electrode pads of said semiconductor chip to one of the common inner-lead and a corresponding inner lead; and sealing said semiconductor chip, said die-pad, said common inner-lead, and said plurality of inner leads in a resin including between said first surface of said semiconductor chip and the second lead frame.

*13. A semiconductor device comprising:*

*a semiconductor chip having a first surface, an opposed second surface, and a plurality of electrode pads linearly disposed substantially on a longitudinal center line of the first surface of said semiconductor chip;*

*a die-pad bonded to the second surface of said semiconductor chip to support the chip and having a smaller area than said semiconductor chip;*

*at least one common inner-lead disposed opposite and spaced from the first surface of said semiconductor chip and substantially. parallel to the longitudinal center line;*

*a plurality of inner leads disposed adjacent to corresponding electrode pads opposite and spaced from the first surface of said semiconductor chip;*

*a plurality of metallic wires electrically connecting respective electrode pads with one of the common inner-lead and the corresponding inner lead;*

*a resin package encapsulating, said semiconductor chip, said die-pad, said common inner-lead, said plurality of inner leads, and said plurality of wires;*

*at least one common outer-lead integrally connected with said common inner-lead* and exposed outside said resin package; and

*a plurality of outer leads, each outer lead being unitary with a corresponding inner lead and exposed outside said resin package wherein said common inner-lead and said plurality of inner leads are spaced from the first surface of said semiconductor chip by a gap filled with resin that is pan of said resin package.*

*14. A semiconductor device comprising:*

*a semiconductor chip having a first surface, an opposed second surface, a first pad-group including a plurality of electrode pads linearly disposed substantially on a longitudinal center line of the first surface of said semiconductor chip, and second and third pad-groups, each including a plurality of electrode pads linearly disposed on opposite sides of the first pad-group;*

*a die-pad bonded to the second surface of said semiconductor chip to support the chip and having a smaller area than said semiconductor chip;*

*first and second common inner-leads disposed opposite and spaced from the first surface of said semiconductor chip and disposed on opposite sides of the first pad-group between the second and third pad-group;*

*a plurality of inner leads spaced from and opposite the first surface of said semiconductor chip beyond the second and third electrode-pad groups:*

*a plurality of metallic wires electrically connecting each first electrode pad with a corresponding one of the first and second common inner-leads and electrically connecting respective pads of the second and third pad-groups with corresponding inner leads;*

*a resin package encapsulating said semiconductor chip, said die-pad, the first and second common inner leads, said plurality of inner leads and said plurality of wires;*

*first and second common outer-leads respectively integrally connected with the first and second common inner-leads and each exposed outside said resin package; and*

*plurality of outer leads, each outer lead being unitary with a corresponding inner-lead and exposed outside said resin package wherein the first and second common inner-leads and said plurality of inner leads are spaced from the first surface of said semiconductor chip by a gap filled with resin that is part of said resin package.*

*15. A method of producing a semiconductor device comprising the steps of:*

*preparing a semiconductor chip which has a first surface, a second surface opposite the first surface, and a plurality of electrode pads linearly disposed on a longitudinal center line of the first surface of said semiconductor chip;*

*placing said semiconductor chip on a first lead frame having a die-pad smaller in area than said semiconductor chip;*

*bonding said die-pad of the first lead frame and a second surface of said semiconductor chip;*

*positioning a second lead frame, including at least one common inner-lead and a plurality of inner leads disposed adjacent to said common inner-lead, opposite and spaced from said first surface of said semiconductor chip to maintain a gap between the first surface of said semiconductor chip and said common inner-lead and said plurality of inner-leads;* wire-*bonding each of said plurality of electrode pads of said semiconductor chip to one of the common inner-lead and a corresponding inner lead; and*

*sealing said semiconductor chips said die-pad, said common inner-lead, and said plurality of inner leads in a resin including between, said first surface of said semiconductor chip and the second lead frame.*

* * * * *

UNITED STATES PATENT AND TRADEMARK OFFICE

CERTIFICATE OF CORRECTION

PATENT NO. : Re. 35,496

DATED : April 29, 1997

INVENTOR(S) : Yamamura et al.

It is certified that error appears in the above-identified patent and that said Letters Patent is hereby corrected as shown below:

Item 57, Abstract, Line 10, change "pan" to --part--;

Column 11, Line 11, after "surface" insert --,--;(2nd occur.)

Line 23, change "tint" to --first--;

Line 45, after "substantially" delete --.--;

Line 54, after "encapsulating" delete --,--;

Line 65, change "pan" to --part--;

Column 12, Line 27, after "leads" insert --,--;

Line 32, before "plurality" insert --a--;

Line 57, after "inner" delete -- - --;

Line 61, change "chips" to --chip--;

UNITED STATES PATENT AND TRADEMARK OFFICE

CERTIFICATE OF CORRECTION

PATENT NO. : Re. 35,496
DATED : April 29, 1997
INVENTOR(S) : Yamamura et al.

It is certified that error appears in the above-indentified patent and that said Letters Patent is hereby corrected as shown below:

Line 61, after "chip" insert --,--;

Line 63, after "between" delete --,--.

Signed and Sealed this

Nineteenth Day of August, 1997

Bruce Lehman

*Attest:*

BRUCE LEHMAN

*Attesting Officer*

*Commissioner of Patents and Trademarks*